United States Patent [19]

Watanabe et al.

[11] Patent Number: 4,823,056
[45] Date of Patent: Apr. 18, 1989

[54] PULSE-WIDTH MODULATION DRIVE CIRCUIT

[75] Inventors: Yoshihiko Watanabe; Tsuneyoshi Nagashita; Susumi Niinuma; Isamu Nomura; Kimito Kobayashi; Akio Namiki; Hiroyuki Abe; Takayuki Iijima; Kazuto Shimokawa; Akira Haeno; Yoshio Aoyagi; Toshiyuki Kimura; Isao Matsumoto, all of Saitama, Japan

[73] Assignee: Pioneer Electronic Corporation, Tokyo, Japan

[21] Appl. No.: 881,540

[22] Filed: Jul. 2, 1986

[30] Foreign Application Priority Data

| Jul. 2, 1985 | [JP] | Japan | 60-145071 |
| Jul. 2, 1985 | [JP] | Japan | 60-145072 |
| Jul. 2, 1985 | [JP] | Japan | 60-145073 |
| Jul. 2, 1985 | [JP] | Japan | 60-145074 |
| Jul. 2, 1985 | [JP] | Japan | 60-145075 |
| Jul. 2, 1985 | [JP] | Japan | 60-145076 |
| Jul. 2, 1985 | [JP] | Japan | 60-145077 |
| Jul. 2, 1985 | [JP] | Japan | 60-145078 |
| Jul. 2, 1985 | [JP] | Japan | 60-145079 |
| Jul. 2, 1985 | [JP] | Japan | 60-145080 |

[51] Int. Cl.$^4$ ............................................. H02P 5/00
[52] U.S. Cl. ................................. 318/341; 318/599; 318/317; 318/257; 318/345B
[58] Field of Search ............... 318/138, 254, 257, 258, 318/259, 262, 266, 267, 269, 278, 280, 282, 283, 286, 287, 288, 289, 293, 294, 298, 299, 300, 314, 316, 317, 318, 326, 327, 328, 331, 332, 339, 340, 341, 345 R, 345 B, 345 E, 345 F, 359, 439, 599-608, 616, 617, 618, 628; 363/41

[56] References Cited

U.S. PATENT DOCUMENTS

| 3,496,441 | 2/1970 | Heider et al. | 318/294 X |
| 3,944,856 | 3/1976 | Horie | 318/341 X |
| 4,020,361 | 4/1977 | Suelzle et al. | 318/599 X |
| 4,204,143 | 5/1980 | Coleman | 318/341 |
| 4,234,835 | 11/1980 | Ota et al. | 318/317 |
| 4,306,181 | 12/1981 | Welburn | 318/599 X |
| 4,368,411 | 1/1983 | Kidd | 318/341 X |
| 4,418,298 | 11/1983 | Suzuki et al. | 318/341 |
| 4,422,023 | 12/1985 | Iwasawa et al. | 318/317 X |
| 4,450,392 | 5/1984 | Gaslonde | 318/345 B X |
| 4,523,134 | 6/1985 | Kinoshita et al. | 318/341 X |
| 4,527,103 | 7/1985 | Kade | 318/293 |
| 4,532,567 | 7/1985 | Kade | 318/434 X |
| 4,544,869 | 10/1985 | Pittaway | 318/257 X |
| 4,546,294 | 10/1985 | Ban et al. | 318/318 X |
| 4,558,264 | 12/1985 | Weischedel | 318/439 X |

Primary Examiner—William M. Shoop, Jr.
Assistant Examiner—Paul Ip
Attorney, Agent, or Firm—Sughrue, Mion, Zinn, Macpeak & Seas

[57] ABSTRACT

A pulse-width modulation drive circuit for a load such as a motor, particularly, a motor used in a compact disc player or the like, in which losses in diodes used to absorb reverse EMF are substantially eliminated. For this purpose, the pulse widths of pulse signals used to on-off control drive current flow through the load are controlled so as to eliminate the diode losses. The circuits of the various embodiments of the invention are designed so as to be easily implemented in integrated circuit form.

16 Claims, 14 Drawing Sheets

PULSE-WIDTH MODULATION DRIVE CIRCUIT

BACKGROUND OF THE INVENTION

The present invention relates to a switching drive circuit, and more particularly, to a circuit which drives a load by switching it on and off in response to a predetermined pulse signal.

Motors and other loads can be driven by several methods, among which the two-way switching drive method is quite common. This method has the advantages of low loss and reduced power consumption, and is particularly effective for driving loads such as motors in battery-powered devices, which may be portable or can be installed on vehicles.

A configuration of a conventional two-way switching drive circuit is shown in FIG. 1A. The circuit includes a pnp transistor $Q_{20}$ and an npn transistor $Q_{21}$, which are connected to each other at their collectors, and a pnp transistor $Q_{22}$ and an npn transistor $Q_{23}$, which are also connected to each other at their collectors. A motor M is connected between the two common collector junctions.

When a negative pulse signal is applied to the base of transistor $Q_{20}$ while a positive pulse signal is being applied to the base of $Q_{23}$, a drive current will flow in the motor M in the direction indicated by a solid-line arrow, causing the motor to rotate in the forward direction. When, on the other hand, a negative pulse signal is applied to the base of transistor $Q_{22}$ and a positive pulse signal to the base of transistor $Q_{21}$, a drive current will flow in the motor M in the direction indicated by a dashed-line arrow, causing the motor to rotate in the reverse direction. As shown in FIG. 1A, one terminal of the motor M is connected to a power supply $V_{cc}$ via a diode $D_{10}$, while the other terminal of the motor is connected to $V_{cc}$ via another diode $D_{11}$. Both diodes serve to absorb reverse electromotive force.

In terms of an equivalent circuit, the motor M consists of two components, a resistance and an inductance. Part of the energy of the drive current flowing in the motor M is consumed in the resistance as driving energy, and the remainder is stored in the inductance. The stored energy produces a reverse electromotive force when the applied drive pulse is removed, and, after flowing through a closed loop including the diode $D_{10}$ or $D_{11}$, the energy will be consumed as driving energy in the resistance. Therefore, theoretically, all of the energy that is generated in the circuit will be consumed as driving energy and the circuit has a linear input vs. output relationship, as indicated by the broken line in FIG. 1B. In practice, however, the energy loss in the diode $D_{10}$ or $D_{11}$ distorts the ideal linear relationship, resulting in the curve shown by the dashed line in FIG. 1B. As shown in FIG. 1C, this causes the small input gain (i.e. the gain when a drive pulse of small width is applied) to be lower than the theoretical value (indicated by the dashed line).

The approximate energy loss which occurs in the two diodes due to absorption of reverse electromotive force will now be calculated. FIG. 2 is a diagram of an equivalent circuit of the switching drive circuit, and FIG. 3 shows waveforms of signals produced in response to a drive pulse (a). If it is assumed that no energy loss occurs in either of the diodes for absorption of reverse electromotive force, the discharge curve will follow the solid line (1) FIG. 3. In fact, however, the diodes cause energy losses as indicated by the solid line (2), and the discharge curve follows the dashed line (3). The energy that is actually consumed in a resistor R is represented by the hatched area $W_A$, and the energy that is lost in the diodes due to absorption of reverse electromotive force is represented by the hatched area $W_B$. The sum of the two areas $W_A$ and $W_B$ represents the theoretical energy consumption in resistor R ($W_O = W_A + W_B$), and the efficiency $\eta$ is expressed by $W_A/W_B$.

Assuming a discharge current of $i(t)$, a peak current of $I_L$ (constant) and the absence of energy loss in either of the diodes due to absorption of reverse electromotive force, the theoretical energy consumption in resistor R ($W_O = W_A$) may be calculated as follows in consideration of the relation $i(t) = I_L \cdot \exp(-R/L)t$:

$$
\begin{aligned}
W_O &= \int_0^\infty (i^2(t) \cdot R) dt \\
&= R \int_0^\infty (I_L \cdot \exp(-R/L)t)^2 dt \\
&= R \cdot I_L^2 \int_0^\infty (\exp(-2R/L)t) dt \\
&= L \cdot I_L^2
\end{aligned}
\tag{1}
$$

Assuming that the current I is zero at time $T_z$, that the peak current on the dashed line (3) in FIG. 5 is $i_p$, and that the peak current caused by reverse electromotive force in the diodes is $I_D$ (a constant), $W_A$, or the actual energy consumption in resistor R, may be calculated as follows:

$$
\begin{aligned}
W_A &= \int_0^{T_E} (i_p^2 \cdot R) dt \\
&= \int_0^{T_E} (((I_L + I_D) \cdot \exp(-R/L)t - I_D)^2 \cdot R) dt \\
&= R((I_L + I_D)^2 (L/2R)(\exp(-2R/L)T_Z - 1) + \\
&\quad 2I_D(I_L + I_D)(L/R)(\exp(-R/L)T_Z - 1) + I_D^2 T_Z)
\end{aligned}
\tag{2}
$$

$T_Z$ may be calculated as follows by using the relation $i_p = (I_L + I_D)(\exp(-R/L)T_Z) - I_D$. Since $i_p = 0$ at $T_Z$, $$(I_L + I_D)(\exp(-R/L)T_Z) = I_D \tag{3}$$

$$
\begin{aligned}
(-R/L) \; T_Z &= \log_e(I_D/(I_L + I_D)) \\
T_Z &= (-L/R) \log_e(I_D/(I_L + I_D))
\end{aligned}
$$

Substituting Eq. (3) into Eq. (2), $$
\begin{aligned}
W_A &= (1/2) L I_L^2 - L I_L I_D + I_D^2 R_D T_Z \\
&= (1/2) L I_L^2 - L I_L I_D - L I_D^2 \log_e(I_D/(I_L + I_D))
\end{aligned}
\tag{4}
$$

Further, $W_B$, or the energy loss in the diodes due to absorption of reverse electromotive force, may be determined as follows:

$$
\begin{aligned}
W_B &= W_O - W_A \\
&= L I_L I_D + L I_D^2 \log_e(I_D/(I_L + I_D))
\end{aligned}
\tag{5}
$$

The efficiency, $\eta$, can then be determined as follows:

$$W_B = W_A/W_O \qquad (6)$$
$$= 1 - (2I_D/I_L) - (2I_D^2/I_L^2) \log_e(I_D/(I_L + I_D))$$

If the number of diodes used for absorbing reverse electromotive force is n and if each diode has a forward voltage drop of $V_F$, the following relation may be written:

$$I_D = nV_F/R.$$

Subtituting this equation and $I_L = (E/R)(1 - \exp(-R_L/L)T_0)$ into equation (6), the efficiency of a drive circuit using n diodes will be calculated as:

$$= 1 - (2nV_F/RI_L)(1 + nV_F/RI_L \cdot \log_e nV_F/(RI_L + nV_F)) \qquad (7)$$

If values of R=10 ohms, E=14.4 volts, L=70 H, $T_0$=2 sec (20 sec×10%), n=2, and $V_F$=0.7 volts are substituted into equation (7), $\eta$ is calculated as 0.606, which means that the efficiency of the drive circuit having these characteristics is 60.6%.

If n=1 and the other conditions are the same, the efficiency is increased to 74.7%.

As will be understood from the foregoing explanation, diodes, which are essential in the switching drive circuit for absorbing reverse electromotive force, cause inevitable energy losses due to the reverse electromotive force they absorb. This energy loss is substantially constant and is small enough to be neglected if the drive pulse has a relatively great pulse width. On the other hand, if the pulse width is small, the relative proportion of the loss is increased and the efficiency of driving the load is lowered to such an extent that the desired drive energy cannot be attained.

The configuration of another prior art PWM drive circuit is shown in FIG. 4B. Two triangular wave signals, a and b, which are in phase, are produced and fed to a comparator circuit 100 as upper and lower reference inputs, with one triangular signal a being biased to a higher d.c. level than the other triangular signal b. A drive signal c is fed to the circuit 100 as the comparison input. As a result, the circuit 100 produces a pair of pulse signals d and e which have pulse widths dependent on the signal level of the drive signal and which correspond to the two directions in which the load is to be driven. The load is driven by being switched on and off in response to the pair of pulse signals d and e. The waveforms of the signals a to e are shown in FIG. 4A.

The PWM drive circuit employs a triangular generator circuit which conventionally has the configuration shown in FIG. 4C, wherein a rectangular wave signal having a predetermined period is converted to a triangular signal by an integrator 101 composed of an operational amplifier $OP_{10}$, resistors $R_{40}$ and $R_{41}$, and a capacitor $C_{10}$. It may be considered to fabricate this integrator-based triangular wave generator circuit in the form of an IC device, in which case two terminal pins $P_1$ and $P_2$ are necessary for making external connection to the capacitor $C_{10}$. However, one of the primary requirements for a circuit configuration that is adaptive for IC device fabrication is that it have a minimum number of terminal pins.

Another difficulty with the conventional motor relates to the fact that it has a "dead zone" where it remains inactive until after the applied drive current exceeds a certain level. Due to the presence of this "dead zone", noise on the drive signal line will not cause the motor to start if the noise level is small. However, the power consumed by that current is still wasted.

When the drive circuit is operated by the power supply connected to one end thereof, the reference level of the circuit, which is set to a value determined by division of the reference supply voltage by, for example, resistors, can vary from the desired level due to factors such as variations in the circuit elements and an offset in the signal level of the drive signal. This offset voltage causes a corresponding current to flow in the motor, even if the signal level is zero, and an extra power loss occurs as in the case of noise production.

Such power loss should be eliminated since it inevitably leads to the use of a larger power unit. In addition, if the PWM drive circuit is used to drive motors in portable devices or those intended to be installed on vehicles, power consumption should be minimized since these devices use batteries as power sources. Smaller power consumption is also desirable in order to reduce the size and weight of these devices.

A circuit configuration of the power drive stage wherein the two transistors on the power supply side are configured as npn transistors is shown in FIG. 5. In this circuit, a first pair of npn transistors $Q_{20}$ and $Q_{21}$ are connected in series with a load, for example, motor M, between a power supply $V_{cc}$ and ground, and a second pair of npn transistors $Q_{22}$ and $Q_{23}$ are also connected in series with the motor M. The circuit further includes pnp transistors $Q_{24}$ and $Q_{25}$ for driving the transistors $Q_{20}$ and $Q_{22}$ on the power supply side. When a forward driving pulse is supplied to transistor $Q_{24}$ through an inverter 20 and to transistor $Q_{21}$, both transistors $Q_{20}$ and $Q_{21}$ are turned on to provide the motor M with a drive current flowing in the direction indicated by a solid-line arrow in FIG. 5, thereby allowing the motor M to be driven in the forward direction. On the other hand, when a reverse driving pulse is supplied to transistor $Q_{25}$ through an inverter 21 and also to transistor $Q_{23}$, both transistors $Q_{22}$ and $Q_{23}$ are turned on to provide the motor M with a drive current flowing in the direction indicated by a dashed-line arrow, thereby driving the motor M in the reverse direction. One terminal of the motor M is connected to the power supply $V_{cc}$ via a diode $D_{10}$, while the other terminal of the motor is connected to $V_{cc}$ via another diode $D_{11}$. Both diodes serve to absorb reverse electromotive force. In this circuit, a higher efficiency is attained with a smaller number of diodes.

Referring again to FIG. 5, transistors $Q_{20}/Q_{22}$ on the power supply side and transistors $Q_{21}/Q_{23}$ on the ground side are both subjected to duty-cycle control by a pulse signal. In addition, drive transistors $Q_{24}$ and $Q_{25}$ are provided in a stage preceding transistors $Q_{20}$ and $Q_{22}$ on the power supply side so to cause the transistors $Q_{20}$ and $Q_{22}$ to undergo a slower transition to the off state than transistors $Q_{21}$ and $Q_{23}$ on the ground side. If, on the other hand, in the forward driving mode, transistor $Q_{21}$ were to undergo a faster transistion to the off state than transistor $Q_{20}$, the energy stored in the coil of motor M would produce a reverse electromotive force which could cause current to flow through a closed loop including diode $D_{10}$, thereby resulting in a consumption of driving energy in the resistance of motor M.

However, in this closed loop, the sum of the voltage drop of diode $D_{10}$ and the base-emitter voltage of transistor $Q_{20}$ can be regarded as $V_F$ in equation (7) above. Since this is equivalent to the presence of two diodes, a great energy loss occurs due to the reverse electromotive force, and the efficiency $\eta$ is only about 60.6%.

SUMMARY OF THE INVENTION

The present invention has been accomplished in order to solve the aforementioned problem. A specific object of the invention is to provide a switching drive circuit which attains a higher efficiency in driving a load by compensating for the energy losses occurring in the diodes serving to absorb reverse electromotive force.

The switching drive circuit provided in accordance with the present invention is of the type which includes a unidirectional element for absorbing reverse electromotive force and which drives a load by switching it on and off in response to a predetermined pulse signal. This circuit compensates for the energy losses in the unidirectional element due to the reverse electromotive force by providing a load drive pulse signal which is produced by increasing the pulse width of the pulse signal by a predetermined amount.

Another object of the present invention is to provide a triangular wave generator circuit which can be fabricated in the form of an IC device with a reduced number of terminal pins.

The triangular wave generator of the present invention includes a first constant-current source and a second constant-current source which has a constant current rating twice the value for the first constant-current source, and is so configured that it produces a triangular wave signal by charging and discharging a capacitor (charge storing means) at a constant current rate with on-off control being performed on the second constant current source.

Yet another object of the invention is to provide a PWM drive circuit for use with a motor which attains the requirement for smaller power consumption by eliminating the power loss in the dead zone of the motor.

The PWM drive circuit of the present invention has a dead zone arranged so that no current will flow in the motor while it is in its dead zone.

Still further, in a PWM drive circuit of the present invention, a unidirectional element for absorbing reverse electromotive force is connected between each terminal of the load and ground in a power drive stage including npn transistors on the power supply side, and the transistors on the power supply side are driven by a pulse signal while those on the ground side are driven by a signal indicating the direction in which the load is to be driven.

DESCRIPTION OF THE PREFERRED EMBODIMENTS

Several preferred embodiments of the present invention will hereinafter be described in detail with reference to the drawings.

Figure 1A:
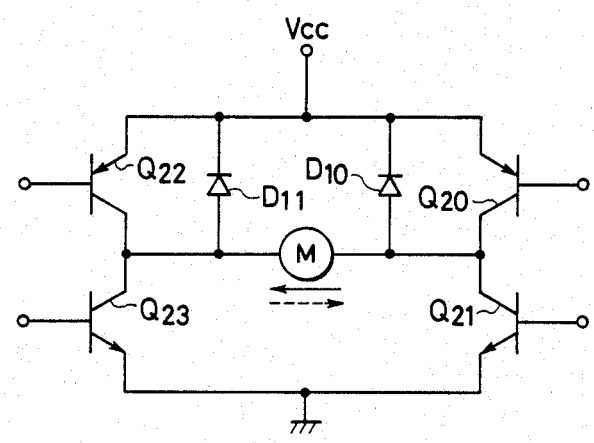
FIG. 1A is circuit diagram showing the basic configuration of a conventional drive circuit.
Figure 1B:
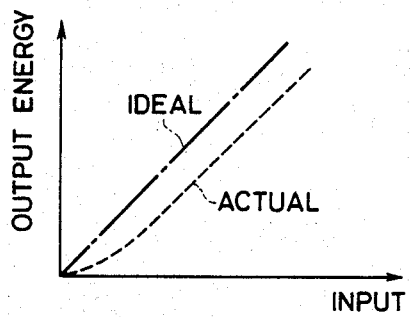
FIG. 1B is diagram showing the input/output characteristics of the switching drive circuit of FIG. 1A.
Figure 1C:
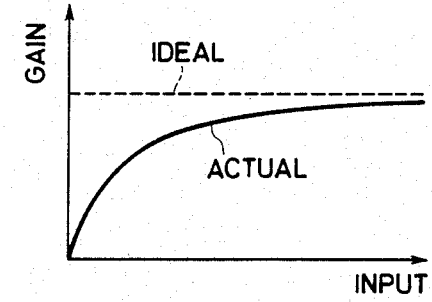
FIG. 1C is a diagram showing the gain characteristics of the switching drive circuit of FIG. 1A.
Figure 2:
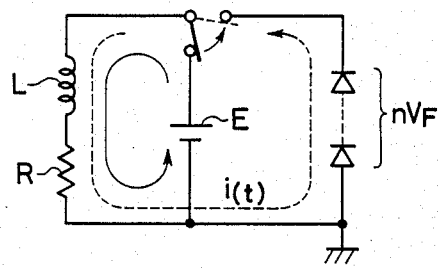
FIG. 2 is a diagram showing an equivalent circuit of the switching drive circuit of FIG. 1A.
Figure 3:
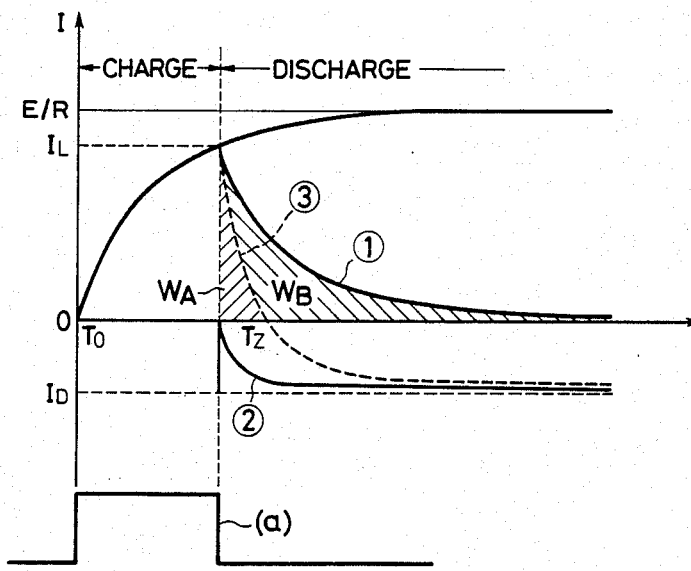
FIG. 3 is a diagram showing a waveform which is generated in response to a drive pulse fed to the switching drive circuit of FIG. 1A.
Figure 4A:
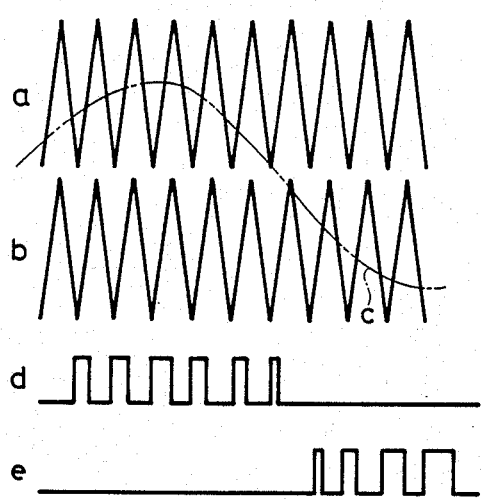
FIG. 4A is a waveform diagram showing signals in the switching drive circuit of FIG. 4B.
Figure 4B:
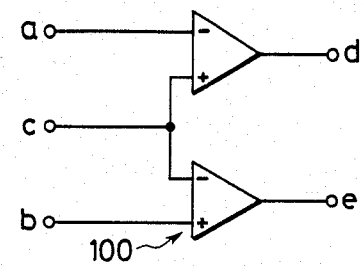
FIG. 4B shows another example of a conventional switching drive circuit.
Figure 4C:
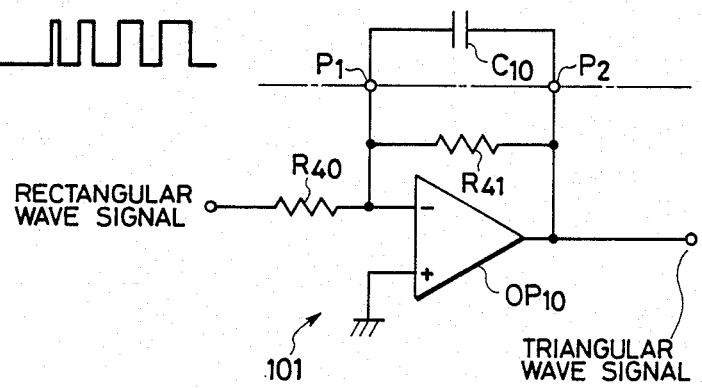
FIG. 4C is a circuit diagram of a conventional triangular wave generating circuit.
Figure 5:
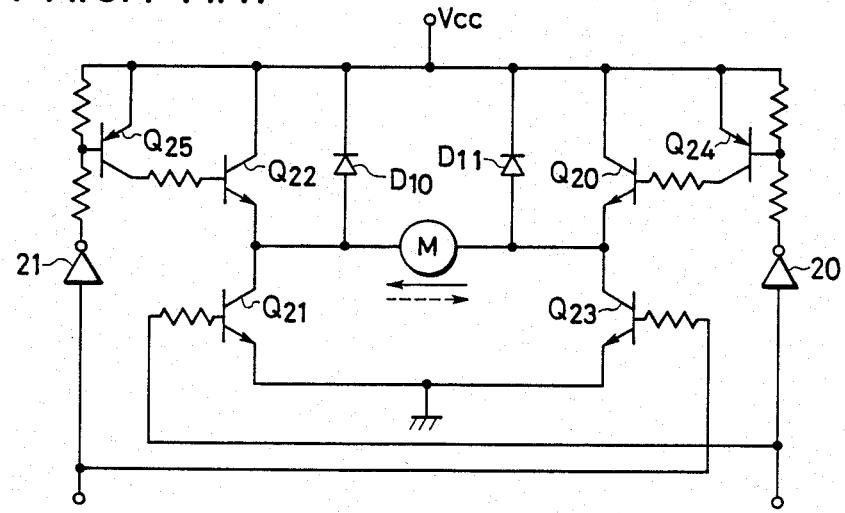
FIG. 5 is a schematic diagram showing still another example of a conventional switching drive circuit.
Figure 6:
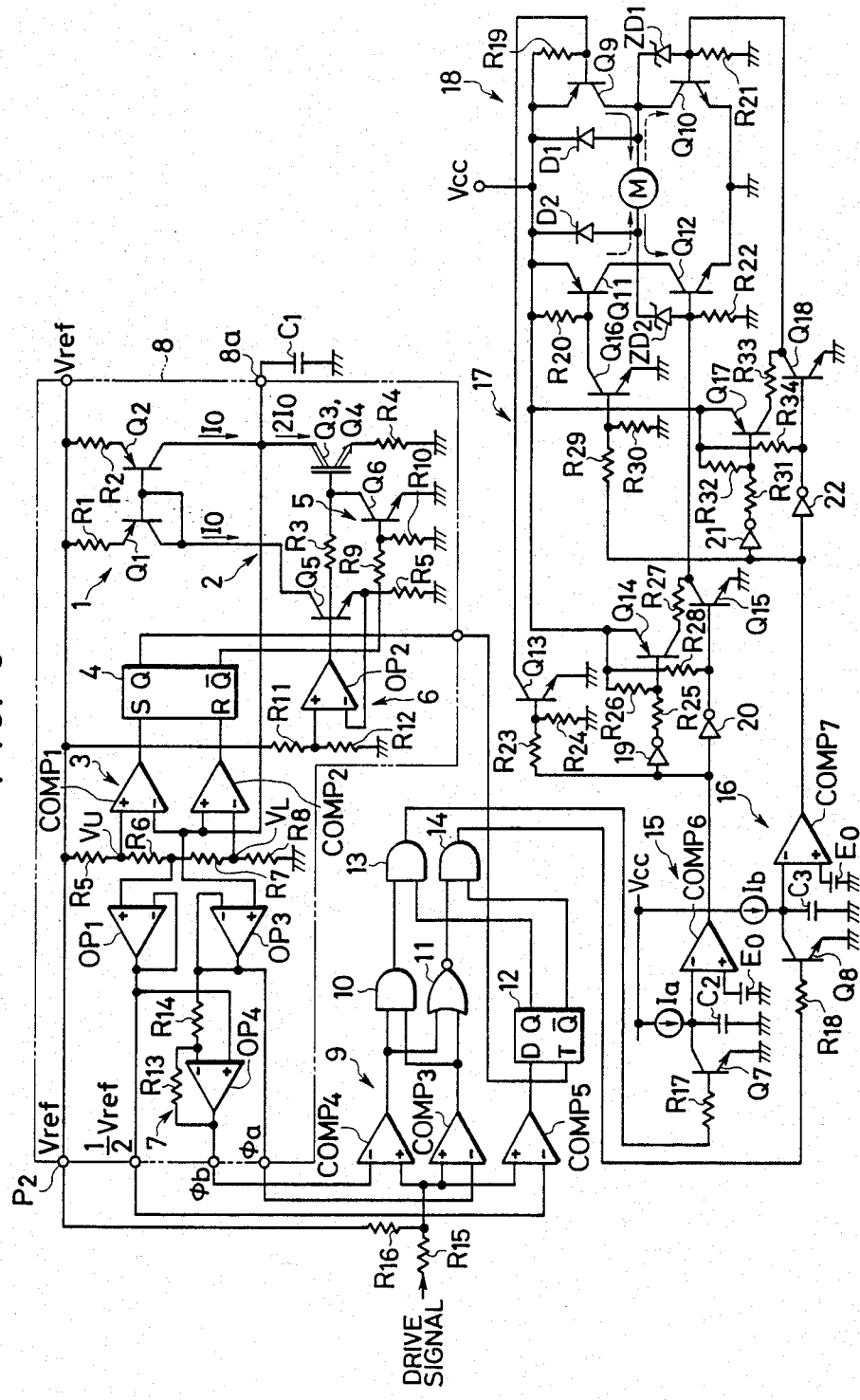
FIG. 6 is a circuit diagram showing a first embodiment of the present invention.

FIG. 6 shows a first constant-current source 1 which is formed of a current-type Miller circuit composed of transistors $Q_1$ and $Q_2$ and resistors $R_1$ and $R_2$. This first constant-current source 1 is series-connected with a second constant-current source 2, which is formed of a current-type Miller circuit composed of parallel-connected transistors $Q_3$ and $Q_4$, transistor $Q_5$ connected to transistors $Q_3$ and $Q_4$ at its base with a resistor $R_3$ inserted therebetween, and emitter resistances $R_4$ and $R_5$ for transistors $Q_3/Q_4$ and $Q_5$, respectively. The second constant-current source 2 is designed to draw a current $2I_0$ which is twice the constant current $I_0$ supplied by the first current source 1. The common junction of the first and second constant-current sources 1 and 2, or the common-collector junction between transistors $Q_2$ and $Q_3/Q_4$, is connected to ground, serving as a reference potential point, and a charge-storing capacitor $C_1$ is connected between the common-collector junction and ground.

The voltage across the capacitor $C_1$ is fed to a comparator circuit 3, which is composed of comparators, $COMP_1$ and $COMP_2$ and which serves as a monitor for the level of the terminal voltage, and is applied to the two comparison inputs of the circuit 3, namely, the inverting input of $COMP_1$ and the noninverting input of $COMP_2$. Upper and reference levels $V_U$ and $V_L$ for comparison by the circuit 3 are set to values determined by division of a reference source voltage $V_{ref}$ by four series-connected resistors $R_5$ to $R_8$. Another function of resistors $R_5$ to $R_8$ is to divide $V_{ref}$ approximately in half. The divided voltage is fed to an operational amplifier $OP_1$ which is configured as a voltage-follower circuit and which produces $(\frac{1}{2})V_{ref}$ as its output. The two comparison outputs of the circuit 3, namely, the outputs from $COMP_1$ and $COMP_2$, are fed to an R-S flip-flop 4 on its set (S) and reset (R) inputs, respectively. The $\overline{Q}$ output of the flip-flop (hereinafter abbreviated as FF) 4 is fed to a control circuit 5 which is composed of a transistor $Q_6$ and resistors $R_9$ and $R_{10}$ and which selectively activates and deactivates the second constant-current source 2. In this control circuit 5, transistor $Q_6$ turns on in response to the $\overline{Q}$ output of FF 4, and, as a result, transistors $Q_3$ and $Q_4$ are turned off to thereby deactivate the second constant-current source 2.

The voltage across the emitter resistance $R_5$ in the second constant-current source 2 is fed to the inverting input of an operational amplifier $OP_2$ configured as a voltage-follower circuit. The reference level for comparison by $OP_2$ is set to a value determined by the division of $V_{ref}$ by resistors $R_{11}$ and $R_{12}$. The operational amplifier $OP_2$ provides a current value setting circuit 6 which uses the comparison output of the amplifier in setting the values of constant currents supplied from the first and second current sources 1 and 2.

The voltage across capacitor $C_1$ is also fed to an operational amplifier $OP_3$ which is configured as a voltage-follower circuit and which produces a triangular-wave signal $\phi_a$ having a first phase. At the same time, the terminal voltage of $C_1$ is inverted in phase by an inverter 7 which is composed of an operational amplifier $OP_4$ and resistors $R_{13}$ and $R_{14}$ and which produces a triangular wave signal $\phi_b$ having a second phase opposite from the phase of the triangular-wave signal $\phi_a$. Each of the two triangular-wave signals $\phi_a$ and $\phi_b$ is supplied with a d.c. bias of $(\frac{1}{2})V_{ref}$.

The aforementioned components 1 to 7 form a triangular wave generator circuit 8 which produces two triangular-wave signals $\phi_a$ and $\phi_b$ having substantially equal peak values and which are opposite to each other in phase. The triangular wave generator circuit 8 includes the first constant-current source 1 providing a constant current output of $I_0$ and the second constant-current source 2 providing a constant current output of $2I_0$, and is designed so as to produce a triangular wave by charging and discharging the capacitor $C_1$ with a constant current as a result of on/off control of the second constant-current source 2. This circuit 8 has the advantage that it can be formed in an IC device with only one additional input/output pin (terminal 8a in FIG. 6), namely, that for the capacitor $C_1$.

The triangular wave signals $\phi_a$ and $\phi_b$ of opposite phases are supplied as the upper and lower reference inputs for comparison by a window comparison circuit 9 composed of comparators $COMP_3$ and $COMP_4$. More specifically, $\phi_a$ is fed to the inverting input of $COMP_3$ and $\phi_b$ to the inverting input of $COMP_4$. The comparison inputs of circuit 9, namely, the noninverting inputs of $COMP_3$ and $COMP_4$, are supplied with a drive signal for a load, specifically, motor M, through a resistor $R_{15}$. The noninverting input terminals of $COMP_3$ and $COMP_4$ are also fed with a reference source voltage $V_{ref}$ through a resistor $R_{16}$ ($R_{15}=R_{16}$). Since $R_{15}$ and $R_{16}$ have equal values of resistance, the drive signal will be biased by $(\frac{1}{2})V_{ref}$ when it is fed to the comparison inputs of the window comparator 9. In other words, the signal reference level of the drive signal is set to $\frac{1}{2}(V_{ref})$.

As a result, both the circuit reference level of the triangular wave generator circuit 8, namely, the comparison reference level of the comparator circuit 3, and the d.c. bias level (signal reference level) of the drive signal are determined by resistance-based division of the same reference source voltage $V_{ref}$. Therefore, even if variations occur in the source voltage, the relative signal levels of the triangular wave signals $\phi_a$ and $\phi_b$ and the drive signal are maintained constant, thereby ensuring consistent operation of the circuit 8.

The comparison output of $COMP_3$ is fed to one input of each of an AND gate 10 and a NOR gate 11, whereas the comparison output of $COMP_4$ is fed to the other input of each gate. As a result, first and second pulse signals associated with the two directions of rotation of motor M are produced at the output terminals of AND gate 10 and NOR gate 11.

The aforementioned drive signal is also fed to the noninverting input of a comparator $COMP_5$ through resistor $R_{15}$. The comparator $COMP_5$, which receives $(\frac{1}{2})V_{ref}$ on its inverting input, forms a polarity determining circuit which determines the polarity of the drive signal with respect to the signal reference level. The decision output from $COMP_5$ is fed to the data (D) input of a D-type flip-flop 12, which receives at its trigger (T) input the Q output of the R-S flip-flop 4 in the triangular wave generator circuit 8. The Q output of D-type flip-flop 12 is fed to one input of an AND gate 13, and the $\overline{Q}$ output is fed to one input of an AND gate 14. The other input of AND gate 3 receives the output of AND gate 10 (i.e., the first pulse signal), and the other input of AND gate 14 receives the output of NOR gate 11 (i.e., the second pulse signal). The two AND gates 13 and 14 form a gate circuit which delivers only one of the first and second pulse signals as its output as determined by the Q and $\overline{Q}$ outputs of D-FF 12.

The output pulses from AND gates 13 and 14 are supplied to compensation circuits 15 and 16 which serve to compensate for the energy loss caused by the reverse electromotive force applied to the diodes $D_1$ and $D_2$ in a motor drive circuit 18 (to be described in detail below). In the compensation circuit 15, the output pulse from AND gate 13 is fed to the base of a transistor $Q_7$ through a resistor $R_{17}$, the transistor $Q_7$ being connected in parallel with a capacitor $C_2$. When transistor $Q_7$ is turned on, the terminals of the capacitor $C_2$ are shorted, causing the stored charge to be quickly discharged. A constant-current source $I_a$ in the compensation circuit 15 starts to charge the capacitor $C_2$ at the point of time when transistor $Q_7$ is turned off, or when the output pulse from the AND gate 13 ceases. The voltage across the capacitor $C_2$ is fed to the inverting input of a comparator $COMP_6$, which receives a reference voltage $E_0$ on its noninverting input and produces a high-level pulse signal when the voltage across the capacitor $C_2$ is higher than $E_0$. As a consequence, the compensation circuit 15 produces a pulse signal which has a pulse of a substantially constant pulse width added to the output pulse from the AND gate 13.

The compensation circuit 16 is configured in a manner similar to the compensation circuit 15; that is, it is composed of a resistor $R_{13}$, a transistor $Q_8$, a capacitor $C_3$, a constant-current source $I_b$, and a comparator $COMP_7$, and it is operated in entirely the same manner as the compensation circuit 15.

The output pulses from the compensation circuits 15 and 16 are supplied to a motor drive circuit 18 through a predrive circuit 17. In the motor drive circuit 18, a motor M is connected between the common-collector junction of a pnp transistor $Q_9$ and an npn transistor $Q_{10}$ and the common-collector junction of a pnp transistor $Q_{11}$ and an npn transistor $Q_{12}$. The transistors $Q_9$, $Q_{10}$, $Q_{11}$ and $Q_{12}$ are power transistors. The emitters of transistors $Q_9$ and $Q_{11}$ are directly connected to a power source $V_{cc}$, while their bases are connected to $V_{cc}$ via resistors $R_{19}$ and $R_{20}$. The emitters of transistors $Q_0$ and $Q_{12}$ are grounded, and their bases are grounded via resistors $R_{21}$ and $R_{22}$ and connected to their collectors via zener diodes $ZD_1$ and $ZD_2$, respectively. The two terminals of the motor M are connected to $V_{cc}$ via diodes $D_1$ an $D_2$, respectively, which serve to absorb reverse electromotive force.

In the predrive circuit 17, the pulse signal supplied from the compensation circuit 15 passes through a predrive stage, composed of resistors $R_{23}$ and $R_{24}$ and a transistor $Q_{13}$, and drives the power transistor $Q_9$. Further the pulse signal is inverted by an inverter 19, passes through a predrive stage, composed of resistors $R_{25}$, $R_{26}$ and $R_{27}$ and a transistor $Q_{14}$, and drives the power transistor $Q_{12}$. As a result, a current flows in the motor M in the direction indicated by a solid-line arrow in FIG. 6, causing the motor M to rotate in the forward direction. The pulse signal from the compensation circuit 15 is also supplied to a transistor $Q_{15}$ through an inverter 20, turning $Q_{15}$ on when the forward driving of the motor M ends. When $Q_{15}$ is turnd on, the power transistor $Q_{12}$ is shorted between its base and the emitter and is turned off substantially instantaneously. (The reason for the inclusion of this transistor $Q_{15}$ will be described in detail below.) The base of $Q_{15}$ is connected to the power source $V_{cc}$ via a resistor $R_{28}$.

The pulse signal supplied from the compensation circuit 16 passes through a predrive stage composed of resistors $R_{29}$ and $R_{30}$ and a transistor $Q_{16}$, and drives the power transistor $Q_{11}$. Also, the pulse signal is inverted by an inverter 21, passes through a predrive stage composed of resistors $R_{31}$, $R_{32}$ and $R_{33}$ and a transistor $Q_{17}$, and drives the power transistor $Q_{10}$. As a result, a current flows in the motor M in the direction indicated by a dashed-line arrow in FIG. 6, driving the motor M in the reverse direction. The constant current from the compensation circuit 16 is also supplied to a transistor $Q_{18}$ through an inverter 22, turning transistor $Q_{18}$ on when the reverse driving of the motor M ends. When transistor $Q_{18}$ is turned on, the power transistor $Q_{10}$ is shorted between its base and emitter and is turned off substantially instantaneously. The base of $Q_{18}$ is connected to $V_{cc}$ via a resistor $R_{34}$.

The operation of the PWM drive circuit in accordance with the present invention will now be described.

Figure 7:
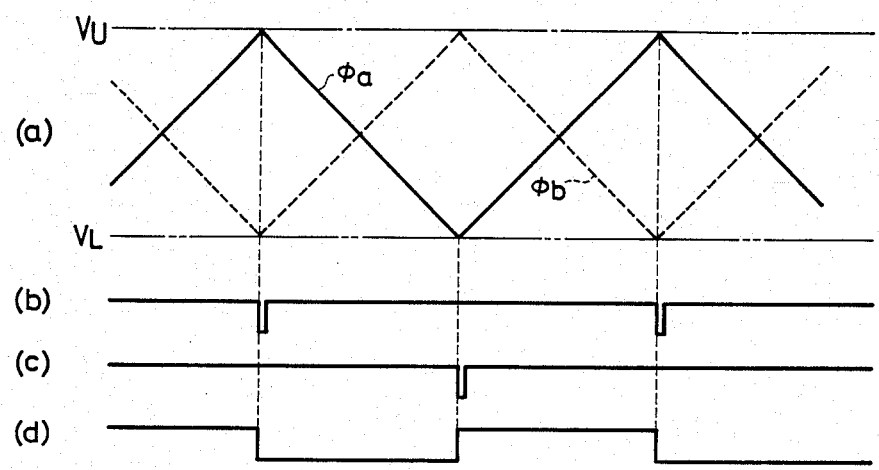
FIG. 7 is a waveform diagram which illustrates the operation of a triangular wave generator included in the circuit shown in FIG. 6.

First, the operation of the triangular wave generator circuit 8 will be described with reference to the waveform diagram of FIG. 7. When the second constant-current source 2 in the circuit 8 is in the deactivated state, in other words, when transistor $Q_6$ is on and transistors $Q_3$ and $Q_4$ are off, the constant current supplied from the first constant-current source 1 causes the capacitor $C_1$ to be charged at a constant rate as shown in FIG. 7, waveform (a). When the voltage across capacitor $C_1$ reaches the upper reference level $V_U$ for the comparator circuit 3, the comparator $COMP_1$ generates a low-level pulse (b), in response to which the $\overline{Q}$ output (d) of R-S flip-flop 4 makes a transition to the low level. As a result, transistor $Q_6$ is turned off and the second constant-current source 2 is activated (i.e., transistors $Q_3$ and $Q_4$ are turned on) to draw a current twice the magnitude of the constant current supplied from the first constant-current source 1.

This causes the charge stored on capacitor $C_1$ to be discharged at the same rate as the charging rate, as shown in waveform (a) of FIG. 7. When the voltage across capacitor $C_1$ reaches the lower reference level $V_L$ for the comparator circuit 3, the comparator $COMP_2$ generates a low-level pulses (c), in response to which the $\overline{Q}$ output (d) of R-S flip-flop 4 makes a transition to the high level. As a result, transistor $Q_6$ is turned on and the second constant-current source 2 is deactivated, which allows capacitor $C_1$ to be recharged at a constant rate by the constant current supplied from the first constant-current source 1.

As capacitor $C_1$ is repeatedly charged and discharged by the constant currents supplied from the first and second constant-current sources 1 and 2, the voltage across capacitor $C_1$ changes cyclically to form a triangular wave, as shown by the solid line of waveform (a) in FIG. 7. This triangular wave signal is fed to the operational amplifier $OP_3$, from which it is delivered as the triangular wave signal $\phi_a$ of the first phase. The output from $OP_3$ is also phase-inverted by the inverter 7 to produce the triangular wave signal $\phi_b$ of the second phase which, as shown by the dashed line in waveform (a) of FIG. 7, has the same peak value as $\phi_a$ and is opposite in phase to $\phi_a$. The two triangular wave signals $\phi_a$ and $\phi_b$ are fed to the comparator circuit 9 as reference inputs.

The comparison inputs of the comparator circuit 9 are fed with the motor drive signal having a signal reference level of $(\frac{1}{2})V_{ref}$. If motor M is a spindle motor, such as may be used for rotating a compact disk, the drive signal is an error signal that is produced by comparing a reproduced sync signal from the disk with a reference sync signal. This error signal provides a basis for controlling the drive of the spindle motor. The drive circuit is then generally referred to as a spindle servo.

The PWM operation of the drive circuit will hereunder be described with reference to FIG. 8 with respect to two cases where the signal level of the drive signal is higher and lower than the level of $(\frac{1}{2})V_{ref}$ at which the two triangular signals $\phi_a$ and $\phi_b$ of opposite phases cross each other.

Figure 8:
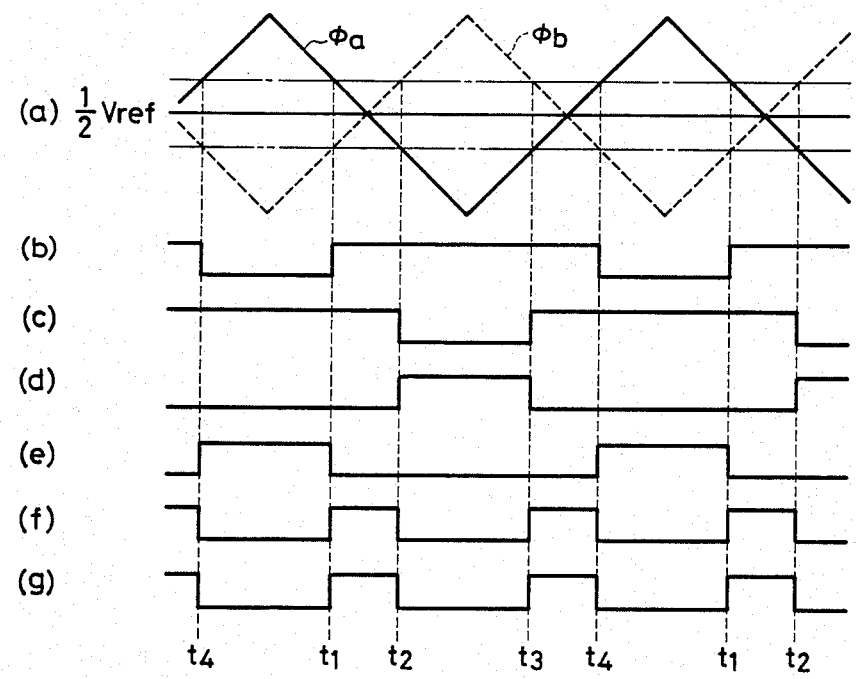
FIG. 8 is a waveform diagram which illustrates the generation of two pulse signals corresponding to the two directions in which a load is driven in a PWM operation.

First, if the signal level of the drive signal which is fed to the comparator circuit 9 is higher than the level of $(\frac{1}{2})V_{ref}$, as indicated by the one-short-and-one-long dashed line of waveform (a) in FIG. 8, the output (b) of the comparator $COMP_3$ makes a transition from the low to the high level at time $t_1$ when the signal level of the triangular wave signal $\phi_a$ of the first phase becomes lower than the signal level of the drive signal, and the resulting high level is maintained up to time $t_4$ when the signal level of $\phi_a$ exceeds that of the drive signal. On the other hand, the output (c) of comparator COMP$_4$ makes a transition from the high to the low level at time $t_2$ when the signal level of the triangular wave signal $\phi_b$ of the second phase exceeds the signal level of the drive signal, and makes a transition to the initial high level at time $t_3$ when the signal level of $\phi_b$ becomes lower than that of the drive signal.

If, on the other hand, the signal level of the drive signal is lower than the level of $(\frac{1}{2})V_{ref}$, as indicated by the two-short-and-one-long dashed line of waveform (a) in FIG. 8, and if the drive signal level has the same absolute value as in the case described above, the output (d) of the comparator COMP$_3$ makes a transition from the low to the high level at the time $t_2$ when the signal level of the triangular wave signal $\phi_a$ of the first phase exceeds the signal level of the drive signal. The resulting high level is maintained to time $t_3$ when the signal level of $\phi_a$ exceeds that of the drive signal. The output (e) of the comparator COMP$_4$ makes a transition from the high to the low level at time $t_1$ when the signal level of the triangular wave signal $\phi_b$ of the second phase exceeds the signal level of the drive signal, and makes a transition to an initial high level at time $t_4$ when the signal level of $\phi_b$ becomes lower than that of the drive signal.

The outputs from comparators COMP$_3$ and COMP$_4$ provide the two inputs for both AND gate 10 and NOR gate 11. When the two inputs to AND gate 10 are at a high level, in other words, when the signal level of the drive signal is higher than $(\frac{1}{2})V_{ref}$, the AND gate 10 produces a high-level pulse (f). When the two inputs to NOR gate 11 are at the low level, in other words, when the signal level of the drive signal is lower than $(\frac{1}{2})V_{ref}$, the NOR gate 11 produces a high-level pulse (g). That is, the AND gate 10 and NOR gate 11 produce pulse signals as shown in waveforms (f) and (g), respectively, as outputs associated with the two rotational directions of the motor M.

The foregoing description assumes that the drive signal has a constant signal level and that the pulse signals (f) and (g) have constant pulse widths. It may, however, be readily understood that the pulse width of each of the pulse signals (f) and (g) is variable depending upon the signal level of the drive signal.

As described above, in accordance with the present invention, two triangular wave signals $\phi_a$ and $\phi_b$ which have equal peak values and are opposite in phase are produced, and the linear portion of each of these triangular wave signals is used to perform the PWM operation. This eliminates any degradation of the linearity of the input vs. output characteristics at small drive signal levels, even if ringing occurs at the apex of a cycle of the triangular wave or if it has a flattened end.

Figure 9A:
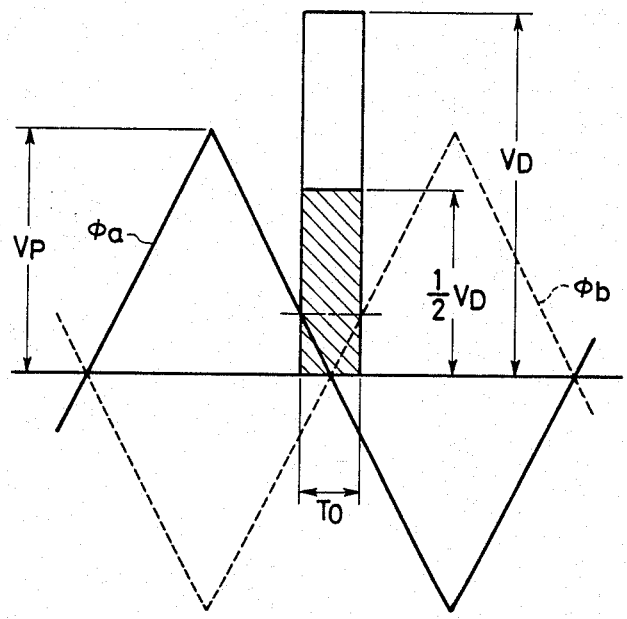
FIGS. 9A and 9B are waveform diagrams which illustrate the operation for changing the ramp rate and peak value of a triangular wave in accordance with variations in the supply voltage.

If variations occur in the reference source voltage $V_{ref}$, the pulse width of the pulse signal generated by PWM will change, and the drive power generated in response to this pulse signal will also change in accordance with the variations in the source voltage. If the pulse signal has a pulse width of $T_0$ at a certain drive signal level as shown in FIG. 9A, the drive power generated in response to this pulse signal is defined by the product of $T_0$ and the drive voltage $V_D$ (with respect to the reference source voltage $V_{ref}$). Therefore, if the drive voltage $V_D$ is reduced by half as a result of variation of the source voltage, the drive power is also reduced to half of its initial level, as indicated by the hatched area in FIG. 9A.

Figure 9B:
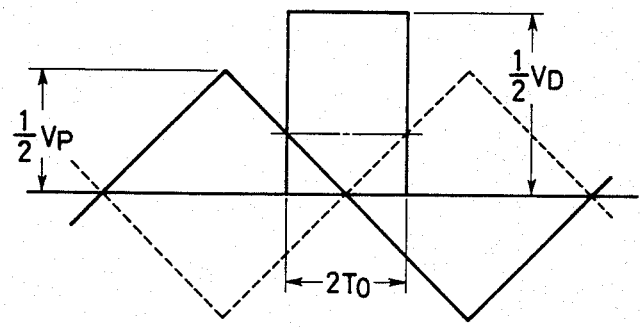

Further, in the triangular wave generator circuit 8, the comparison reference levels for the current value setting circuit 6, which serves to set the values of the constant currents supplied from the first and second constant-current sources 1 and 2, are determined by division of the reference source voltage $V_{ref}$ by resistors $R_{11}$ and $R_{12}$, and hence will follow the variations in the source voltage. Because of this feature, the current value setting circuit 6 is capable of controlling the values of the constant currents from the first and second constant-current sources 1 and 2 in accordance with the variation in the source voltage, thereby making the ramp of the triangular wave change as shown in FIG. 9B. In addition, the upper and lower reference levels $V_U$ and $V_L$ used for comparison by the circut 3 are set to values which are determined by division of $V_{ref}$ by resistors $R_5$ to $R_8$. Therefore, if $V_{ref}$ is reduced by half, the upper and lower reference levels $V_U$ and $V_L$ are also reduced by half, with the result that the peak value $V_P$ of the triangular wave is reduced to half the initial value (i.e., the value attained before the variations in the source voltage), as shown in FIG. 9B. In other words, if the ramp rate of the triangular wave is set such that the repetition rate of the signal is the same before and after any variation in the source voltage, a pulse signal will be formed whose pulse width is $2T_0$, twice the width attained before the variation in the source voltage. Therefore, even if a variation occurs in the source voltage and the drive voltage $V_D$ is reduced by half, the drive power generated in response to the pulse signal will remain unchanged.

In other words, the triangular wave generator circuit 8 controls the peak value and ramp rate of the triangular wave in accordance with any variation that is introduced into the source voltage, and, as a result of this control action, the drive power generated in response to the pulse signal is maintained constant, irrespective of the variations in the reference source voltage $V_{ref}$. In this connection, it should be mentioned that the ramp rate of the triangular wave is determined by the values of the constant currents supplied from the first and second constant-current sources 1 and 2 and by the capacitance of the capacitor $C_1$.

Figure 10:
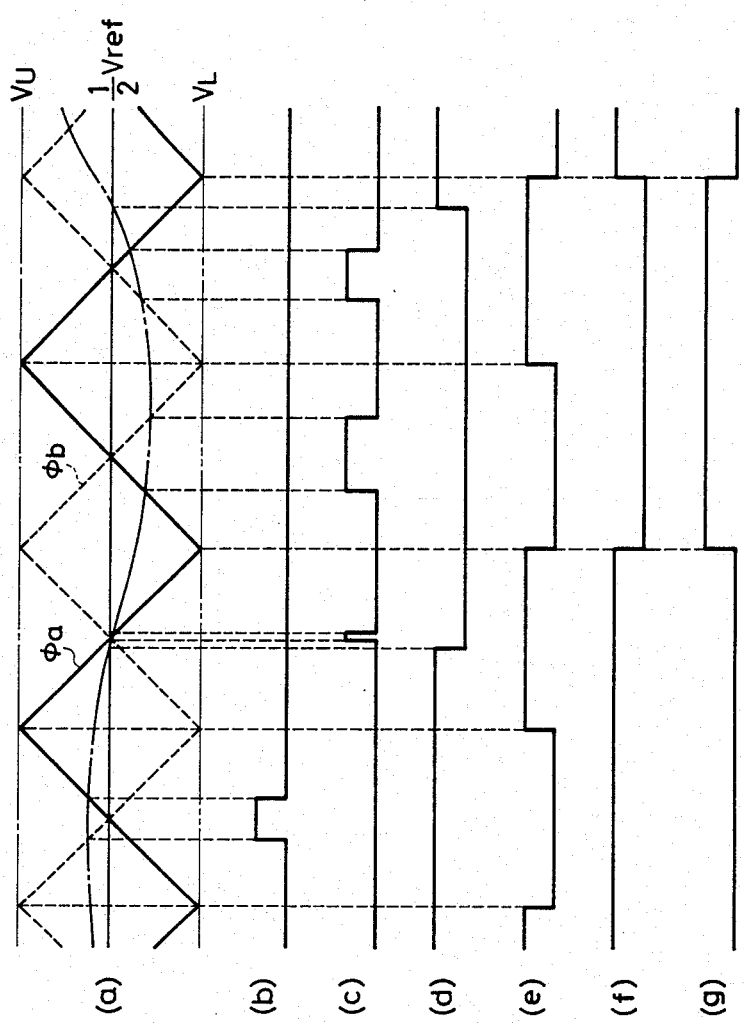
FIG. 10 is a waveform diagram which illustrates the operation of a circuit which prevents power transistors in a drive stage from being turned on simultaneously due to a delay time of each transistor.

Returning now to FIG. 6, if the signal level of the drive signal changes as shown by the one-short-and-one-long dashed line in FIG. 10, waveform (a), two pulse signals (b) and (c) having pulse widths corresponding to the polarity and signal level of the drive signal are produced from the outputs of AND gate 10 and NOR gate 11. Signal (b) is fed to one input of the AND gate 13 while signal (c) is fed to one input of the AND gate 14. The drive signal is also fed to the comparison input of comparator COMP$_5$ for the purpose of determining the polarity of the drive signal with respect to the signal reference level $(\frac{1}{2})V_{ref}$. The comparison output (d) of COMP$_5$ is fed to the data (D) input of the D-type flip-flop 12, which is triggered by the Q output (e) of the R-S flip-flop 4 in the triangular wave generator circuit 8, and produces Q and $\overline{Q}$ outputs (f) and (g), respectively, at the timing determined by the fall of the Q output (e) of the R-S flip-flop 4. The Q and $\overline{Q}$ outputs (f) and (g), respectively, produce gate control signals which are supplied to the AND gates 13 and 14, respectively.

In the embodiment described above, the Q output (e) of the R-S flip-flop 4 is directly fed to the trigger input of the D-type flip-flop 12. Alternatively, the Q output (e) of the R-S flip-flop 4 may be fed to the trigger input T of the D-type flip-flop 12 through a pulse generator 5 that generates pulses at the rise and fall of the Q output (e). This modification reduces the cycle period of polarity decision by half and doubles the resolution.

The, Q and $\overline{Q}$ outputs (f) and (g), respectively, of the D-type flip-flop 12 serve as control signals for determining the direction in which the motor M is driven.

If the drive signal is at the low signal level and a pulse signal for effecting motor driving in the reverse direction is generated from the NOR gate 11 momentarily when the polarity of the drive signal changes from positive to negative (as indicated by the first pulse (c) in FIG. 10), at the point of time when such reverse driving pulse signal is generated, the $\overline{Q}$ output (g) is at low level and the AND gate 14 is operated so as to inhibit the outputting of the $\overline{Q}$ signal. The reason for performing this inhibitory operation will be described below.

It is assumed that the drive signal is at the low signal level and also that a pulse of the signal for effecting motor driving in the reverse direction is generated from the NOR gate 11 momentarily when the drive signal (c) changes its polarity from positive to negative as shown in FIG. 10. In the motor drive circuit 18, transistors $Q_9$ and $Q_{12}$ are thus turned on in response to the pulse signal (b) shown in FIG. 10 to drive the motor M to rotate in the forward direction. However, when a pulse of the signal (c) for driving in the reverse direction is generated, transistors $Q_9$ and $Q_{12}$ are turned off whereas transistors $Q_{11}$ and $Q_{10}$ are turned on to drive the motor M to rotate in the reverse direction.

Figure 11:
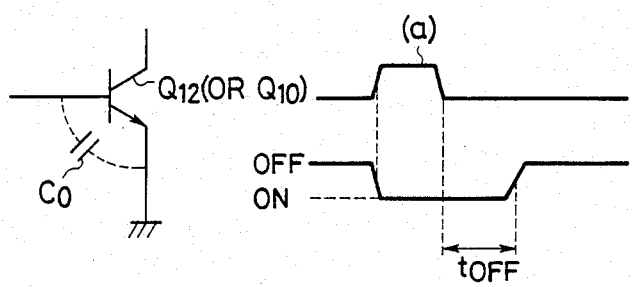
FIG. 11 is a diagram which illustrates the delay time of a transistor.

As shown in FIG. 11, a transistor has a capacitance $C_0$ between its base and emitter. When a drive pulse (a) is applied to a transistor in the conducting (on) state, the transistor will be turned off only when a certain delay time ($t_{off}$) lapses after the pulse (a) ceases to exist. If a pulse signal (c) for driving in the reverse direction is generated as shown in FIG. 10, transistors $Q_9$ and $Q_{12}$ will theoretically be turned off while transistors $Q_{11}$ and $Q_{10}$ are turned on. In fact, however, the delay time $t_{off}$ prevents transistor $Q_{12}$ from being turned off instantly, and hence both transistors $Q_{12}$ and $Q_{11}$ will remain conducting temporarily. As a result, a large current will flow in transistors $Q_{11}$ and $Q_{12}$ which could cause their failure.

The PWM drive circuit of the present invention includes AND gates 13 and 14 which are controlled in response to the polarity of the drive signal with respect to the signal reference level. If a pulse signal (c) for driving in the reverse direction is generated as shown in FIG. 10, AND gate 14 will inhibit the outputting of the pulse signal in response to the $\overline{Q}$ output (g) of the D-type flip-flop 12, which prevents transistor $Q_{12}$ from being turned on simultaneously with transistor $Q_{11}$.

An additional feature of the PWM drive circuit of the present invention is that transistors $Q_{15}$ and $Q_{18}$ are provided for the purpose of reducing the delay time $t_{off}$ of each of the power transistors $Q_{12}$ and $Q_{10}$. The transistors $Q_{15}$ and $Q_{18}$ are turned on momentarily in response to the disappearance of the drive pulse that was applied to power transistors $Q_{12}$ and $Q_{10}$, and the transistors $Q_{12}$ and $Q_{10}$ are shorted between their base and emitter, thereby shortening the delay time $t_{off}$ of each of the power transistors $Q_{12}$ and $Q_{10}$. Transistors typically have a delay time ($t_{off}$) ranging from about 1 to 2 $\mu$sec, but this can be reduced by about one order of magnitude to approximately 100 nsec because of the inclusion of transistors $Q_{15}$ and $Q_{18}$.

Figure 12:
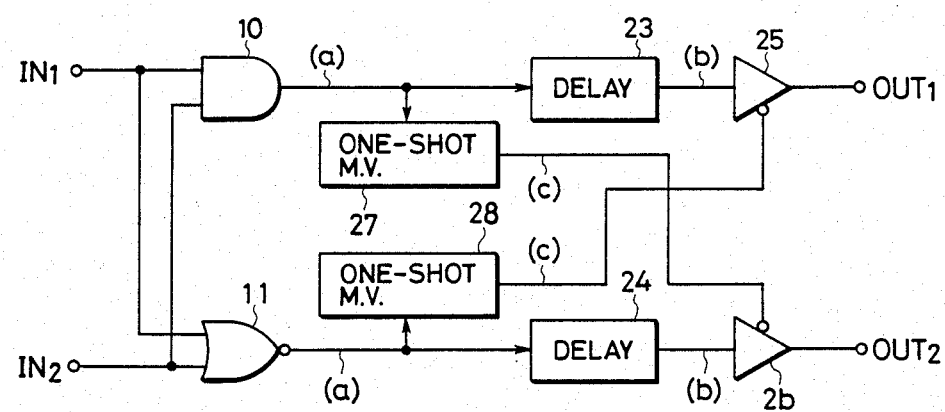
FIG. 12 is a block diagram showing another embodiment of a circuit for preventing the power transistors from being turned on simultaneously.

Another embodiment for preventing power transistors $Q_{12}$ and $Q_{10}$ from being turned on simultaneously is shown in FIG. 12. In the circuit shown in FIG. 12, first and second pulse signals (a), which are associated with the two directions in which the motor M is driven, are outputted from the AND gate 10 and NOR gate 11 and are fed to delay circuits 23 and 24 where they are delayed by a predetermined time $t_0$. The delayed outputs (b) are supplied to tri-state buffers 25 and 26. The first and second pulse signals (a) are also fed to one-shot multivibrators 27 and 28. The one-shot multivibrators 27 and 28 continue to produce low-level outputs (c) from the point of time when the first and second pulse signals are generated until a certain period lapses after they cease to exist, preferably until after a duration of $2\tau_0$, namely, twice the delay time $\tau_0$ of each of the delay circuits 23 and 24. The low-level outputs (c) so produced are supplied to buffers 26 and 25 which buffer the second and first pulse signals from the delay circuits 24 and 3 before they are supplied to the next stage.

Figure 13:
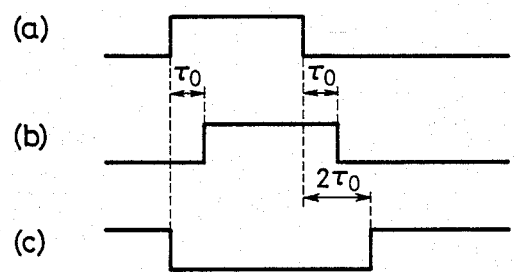
FIG. 13 is a waveform diagram which illustrates the operation of the circuit shown in FIG. 12.

FIG. 13 is a waveform diagram showing the operation of the circuit depicted in FIG. 12. In FIG. 13, (a) to (c) indicate waveforms of the signals (a) to (c) produced in the circuit shown in FIG. 12. The following description of the operation of the circuit shown in FIG. 12 concerns mainly the AND gate 10 with reference being made to the waveform diagram of FIG. 13.

The pulse signal (a) is delayed by time $\tau_0$ in circuit 23 to form the drive pulse (b) for the motor M. At the same time, one-shot multivibrator 27 produces a low-level inhibiting signal (c), and, in response to this signal, buffer 26 interrupts the line on which the other drive pulse is outputted. As a result, the outputting of the other drive pulse is inhibited for a given period (time $\tau_0$) before and after the generation of the drive pulse (b). If the time $\tau_0$ is set to a value which is longer than the delay time $t_{off}$ of each of the power transistors $Q_{12}$ and $Q_{10}$, there is no possibility that the power transistors $Q_9$ and $Q_{10}$ (or $Q_{11}$ and $Q_{12}$) will be turned on simultaneously.

As mentioned above, transistors typically have a delay time $t_{off}$ ranging from about 1 to 2 $\mu$sec, and hence the time $\tau_0$ is desirably set to a value of about 5 $\mu$sec.

Figure 14:
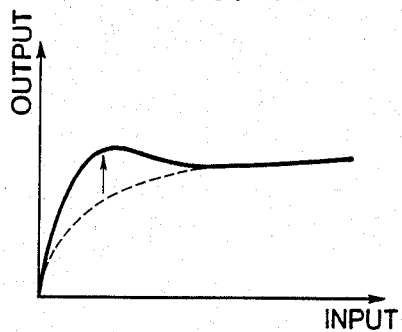
FIG. 14 is a diagram which illustrates a gain deterioration caused by the energy loss occurring in reverse EMF absorbing diodes.

In the circuit shown in FIG. 6, the first and second pulse signals from the AND gates 13 and 14 associated with the two respective rotational directions in which the motor M is driven, are supplied to the compensation circuits 15 and 16, respectively. The compensation circuits 15 and 16 serve to compensate for the energy loss which occurs in reverse EMF absorbing diodes $D_1$ and $D_2$ in the motor drive circuit 18. The energy loss occurring in the diodes $D_1$ and $D_2$ is substantially constant and is negligible if the pulse signal has a large pulse width, but the proportion of this energy loss increases as the pulse width decreases. As a result, the gain will drop in the region where the pulse signal has a small pulse width, as indicated by the dashed line in FIG. 14. In other words, the energy loss occurring in the reverse EMF absorbing diodes $D_1$ and $D_2$ needs to be compensated when the pulse signal has a small pulse width.

Figure 15:
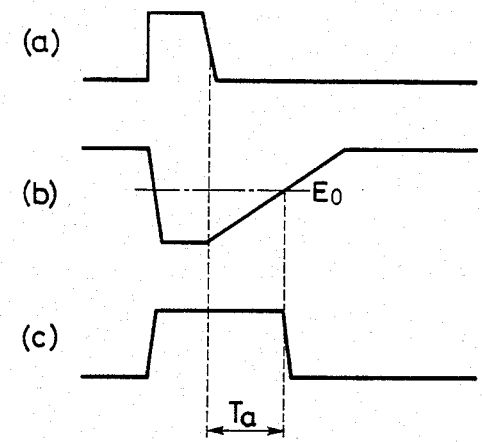
FIG. 15 is a waveform diagram which illustrates the operation of a compensation circuit for compensating for the energy loss which occurs in the reverse EMF absorbing diodes.

The operation of the compensation circuit 15 will hereunder be described with reference to the waveform diagram of FIG. 15. Capacitor $C_2$ has been charged with a constant current by the constant-current source $I_a$. When transistor $Q_7$ turns on in response to an input pulse (a), the charge stored in $C_2$ is discharged momentarily. When the input pulse (a) ceases the capacitor $C_2$ is recharged at a constant rate. Therefore, the voltage (b) across $C_2$ changes as shown in FIG. 15. The terminal voltage (b) is compared with a reference voltage $E_0$ by comparator $COMP_7$, and, as a result, the output terminal of $COMP_7$ is provided with a pulse signal (c) having a pulse width which is equivalent to the time interval from the generation of the input pulse (a) to the time when a given time $T_a$ lapses after the disappearance of the input pulse. In other words, a given pulse width $T_a$ is added to the input pulse (a), and the energy corresponding to the added pulse width $T_a$ serves to compensate for the energy loss occurring in the reverse EMF absorbing diodes $D_1$ and $D_2$.

Figure 16:
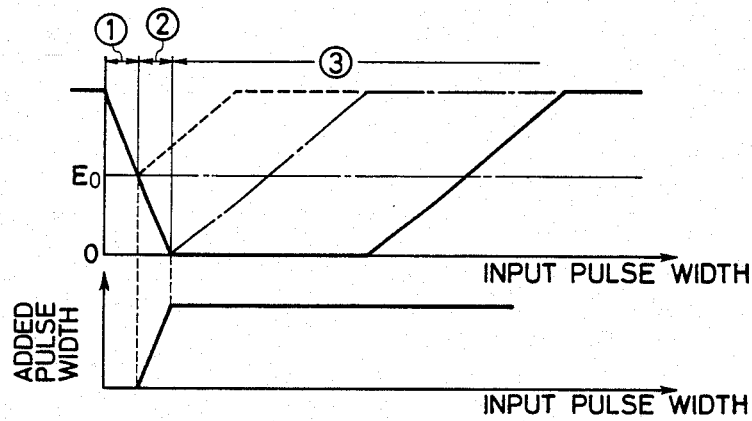
FIG. 16 is a diagram showing the input/output characteristics of the compensation circuit.

FIG. 16 shows the input/output characteristics of the compensation circuits 15 and 16, or the relationship between the pulse width of an input pulse and the pulse width added thereto. In region (1) of the pulse width of an input pulse where the voltage across capacitor $C_2$ is higher than the reference voltage $E_0$ for comparator $COMP_7$, there is no addition of pulse width; in region (2) where the voltage across $C_2$ drops below $E_0$ and approaches zero, the added pulse width increasing linearly; and in region (3) where the voltage across $C_2$ levels off at zero, a fixed pulse width is added to the input pulse. In regions (1) and (2) where the input pulse has a very small pulse width, no addition of pulse width occurs or the added pulse width increases linearly due to the fact that, in actual operation, the input pulse rises and falls with a gradual slope rather than sharply, with the result that the gain attained in region (2) is improved, as shown by the solid line in FIG. 14.

Figure 17:
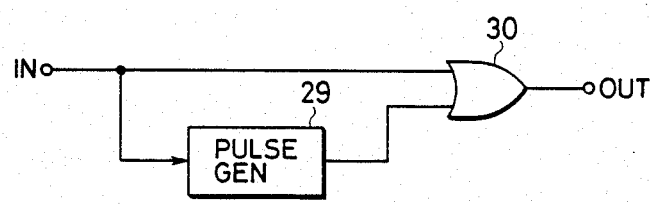
FIG. 17 is a block diagram showing another embodiment of the compensation circuit.

The configuration of the compensation circuits 15 and 16 is not limited to the embodiment described above. One possible modification is shown in FIG. 17, wherein each of the compensation circuits is composed of a pulse generator circuit 29 which generates a pulse signal of a given pulse width $T_b$ in response to the rising edge of the input, pulse, and an OR gate 30 which produces the logical sum of the input pulse and the output pulse from the pulse generator circuit 29. If an input pulse having a pulse width smaller than the pulse width $T_b$ is supplied to this modified circuit, the OR gate 30 will produce a pulse signal having a pulse width $T_b$. As a result, the energy loss which occurs in the reverse EMF absorbing diodes $D_1$ and $D_2$ when the input pulse has a small pulse width is compensated, while no such change in the pulse width is effected if the input pulse has a pulse width larger than $T_b$.

The description of the foregoing embodiments assumes that the present invention is applied to a circuit for driving a spindle motor which drives a compact disk or the like. It should, however, be noted that the present invention is also applicable to various drive circuits such as a circuit for driving a pickup driving carriage motor, a circuit for driving a focus actuator which controls the focusing of light used in reading information with a pickup, and a circuit for driving a tracking actuator which controls the tracking of such light. The application of the present invention is by no means limited to compact disk players, and it may be applied to various other circuits used in driving loads in a variety of machines.

Figure 18:
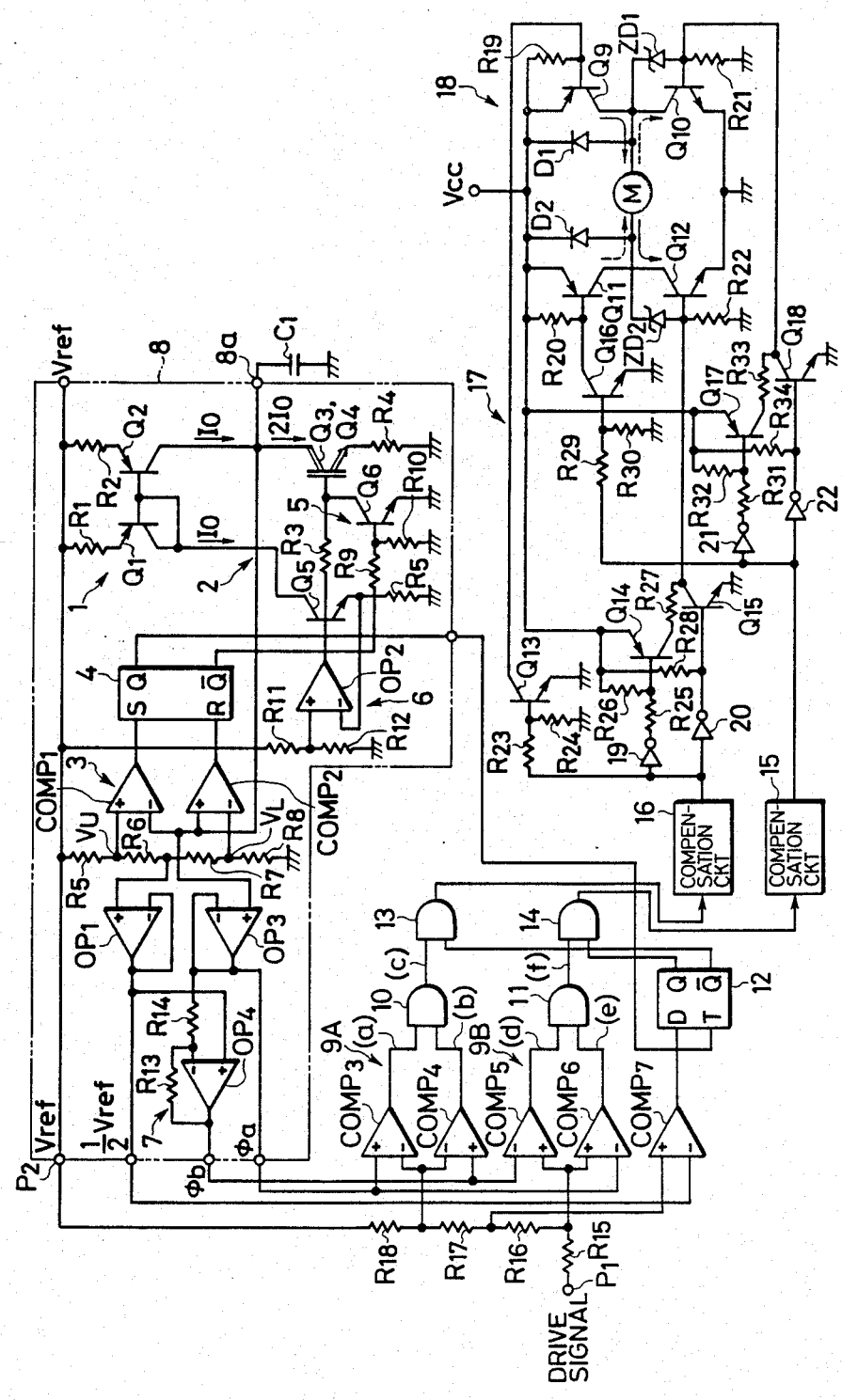
FIG. 18 is a circuit diagram, similar to FIG. 6, showing a pulse-width modulation drive circuit of a second embodiment of the invention.

Another preferred embodiment of the invention will now be explained with reference to FIGS. 18 to 21. FIG. 18 is a schematic diagram of a PWM drive circuit of this embodiment of the invention. As the embodiment of FIG. 18 is similar in many respects to that of FIG. 6, the discussion below relates primarily only to the differences between the two.

The triangular signals $\phi_a$ and $\phi_b$ of opposite phases are supplied to first and second comparator circuits 9A and 9B. The first comparator circuit 9A is composed of a pair of comparators $COMP_3$ and $COMP_4$ which receive the signals $\phi_a$ and $\phi_b$ on their noninverting inputs. The second comparator circuit 9B is composed of a pair of comparators $COMP_5$ and $COMP_6$ which receive the signals $\phi_a$ and $\phi_b$ on their inverting inputs. The inverting inputs of $COMP_3$ and $COMP_4$ and the noninverting inputs of $COMP_5$ and $COMP_6$ are fed with a drive signal for motor M which has its signal reference level shifted by resistors $R_{15}$ to $R_{18}$ connected in series between an input terminal $P_1$ and a reference source ($V_{ref}$) terminal $P_2$.

The resistors $R_{15}$ and $R_{18}$ have the same value of resistance, as do the resistors $R_{16}$ and $R_{17}$. The values of resistors $R_{15}$ and $R_{18}$ are comparatively larger than those of $R_{16}$ and $R_{17}$. As a result of these resistance values, the drive signal fed to the inverting input of each of the comparators $COMP_3$ and $COMP_4$ is shifted from the center level of each triangle signal $((\frac{1}{2})V_{ref})$ by a predetermined positive level $(+\Delta V)$, while the drive signal fed to the inverting input of each of the comparators $COMP_5$ and $COMP_6$ is shifted from the center level $((\frac{1}{2})V_{ref})$ by a predetermined negative level $(-\Delta V)$.

The outputs of comparators $COMP_3$ and $COMP_4$ are fed to the two inputs of an AND gate 10, while the outputs of comparators $COMP_5$ and $COMP_6$ are fed to the two inputs of an AND gate 11. As a result, first and second pulse signals corresponding to the two directions in which the motor M is to be driven are produced at the output terminals of AND gates 10 and 11.

The aforementioned drive signal is also fed to the noninverting input of a comparator $COMP_7$ after it has been provided with the signal reference level of $(\frac{1}{2})V_{ref}$ by means of resistors $R_{15}$ to $R_{18}$. The comparator $COMP_7$ receives $(\frac{1}{2})V_{ref}$ at its noninverting input and determines the polarity of the drive signal with reference to the signal reference level. The decision output from $COMP_7$ is fed to the data (D) input of a D-type flip-flop 12, which receives at its trigger (T) input the Q output of the R-S flip-flop 4 in the triangular generator circuit 8. The $\overline{Q}$ output of the D-type flip-flop 12 is fed to one input of an AND gate 13, and the Q output is fed to one input of an AND gate 14. The other input of AND gate 13 receives the output of AND gate 10 (i.e., first pulse signal), and the other input of AND gate 14 receives the output of AND gate 11 (i.e., second pulse signal). The two AND gates 13 and 14 form a gate circuit which delivers only one of the first and second pulse signals as its output as determined by the state of the $\overline{Q}$ and Q outputs of the D-type flip-flop 12. The output pulses from the AND gates 13 and 14 are supplied to compensation circuits 15 and 16 which serve to compensate for the energy loss occurring in reverse EMF absorbing diodes $D_1$ and $D_2$ in a motor drive circuit 18. The compensation circuits 15 and 16 output pulse signals composed of pulses of a substantially constant pulse width added to the output pulses from AND gates 13 and 14. The output pulses from compensation circuits 15 and 16 are supplied to the motor drive circuit 18 through a predrive circuit 17.

In the motor drive circuit 18a, motor M is connected between the common-collector junction of a pnp transistor $Q_9$ and an npn transistor $Q_{10}$ and the common-collector junction of a pnp transistor $Q_{11}$ and an npn transistor $Q_{12}$. The transistors $Q_9$, $Q_{10}$, $Q_{11}$ and $Q_{12}$ are power transistors. The emitters of transistors $Q_9$ and $Q_{11}$ are directly connected to a power supply $V_{cc}$, while their bases are connected to $V_{cc}$ via resistors $R_{19}$ and $R_{20}$. The emitters of transistors $Q_{10}$ and $Q_{12}$ are grounded; and their bases are grounded via resistors $R_{21}$ and $R_{22}$ and connected to their collectors via zener diodes $ZD_1$ and $ZD_2$, respectively. The terminals of motor M are connected to $V_{cc}$ via diodes $D_1$ and $D_2$ which serve to absorb reverse electromotive force.

In the predrive circuit 17, the pulse signal supplied from the compensation circuit 16 passes through a predrive stage composed of resistors $R_{23}$ and $R_{24}$ and a transistor $Q_{13}$ and drives the power transistor $Q_9$. At the same time, the pulse signal is inverted by an inverter 19, passes through a predrive stage composed of resistors $R_{25}$ to $R_{27}$ and a transistor $Q_{14}$, and drives the power transistor $Q_{12}$. As a result, a current flows in the motor M in the direction indicated by a solid-line arrow (FIG. 18) and causes the motor M to rotate in the forward direction. The pulse signal from the compensation circuit 16 is also supplied to a transistor $Q_{15}$ through an inverter 20 and turns $Q_{15}$ on when the forward driving of the motor M ends. When $Q_{15}$ is turned on, the power transistor $Q_{12}$ is shorted between its base and emitter, turning it off substantially instantaneously. The base of $Q_{15}$ is connected to the power supply $V_{cc}$ via a resistor $R_{28}$.

The pulse signal supplied from the compensation circuit 15 passes through a predrive stage composed of resistors $R_{29}$ and $R_{30}$ and a transistor $Q_{16}$, and drives the power transistor $Q_{11}$. At the same time, the pulse signal is inverted by an inverter 21, passes through a predrive stage composed of resistors $R_{31}$ to $R_{33}$ and a transistor $Q_{17}$, and drives the power transistor $Q_{10}$. As a result, a current flows in the motor M in the direction indicated by the dashed-line arrow (FIG. 18), and the motor M is driven to rotate in the reverse direction. The constant current from the compensation circuit 15 is also supplied to a transistor $Q_{18}$ through an inverter 22 and turns $Q_{18}$ on when the reverse driving of the motor M ends. When $Q_{18}$ is turned on, the power transistor $Q_{10}$ is shorted between its base and emitter, and is turned off substantially instantaneously. The base of $Q_{18}$ is connected to $V_{cc}$ via a resistor $R_{34}$.

The comparison inputs of the first and second comparison circuits 9A and 9B are fed with motor drive signals having signal reference levels of $(\frac{1}{2})V_{ref}+\Delta V$ and $(\frac{1}{2})V_{ref}-\Delta V$. If motor M is a spindle motor for rotating a spindle disk, each of the drive signals may be an error signal produced by comparing a reproduced sync signal from the disk with a reference sync signal. This error signal provides a basis for controlling the driving of the spindle motor.

Figure 19:
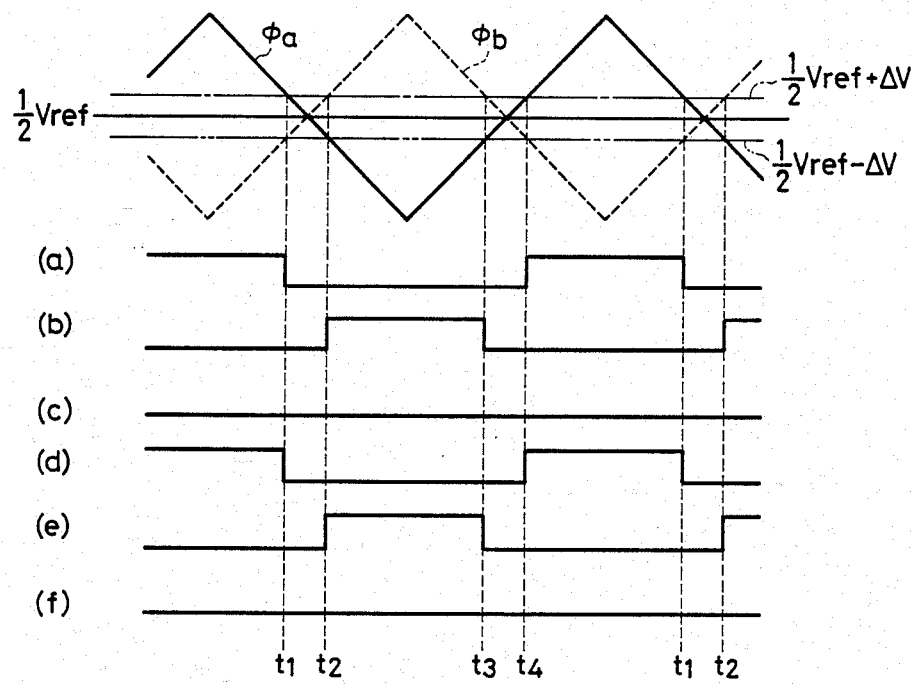
FIGS. 19 to 21 are waveform diagrams illustrating various operations of the circuit of FIG. 18.
Figure 20:
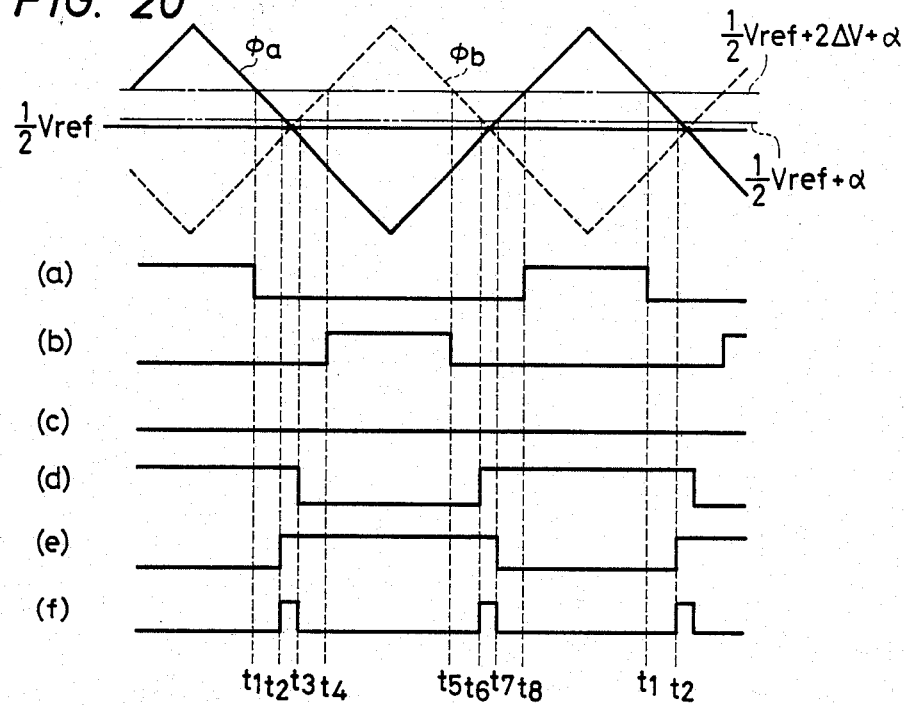
Figure 21:
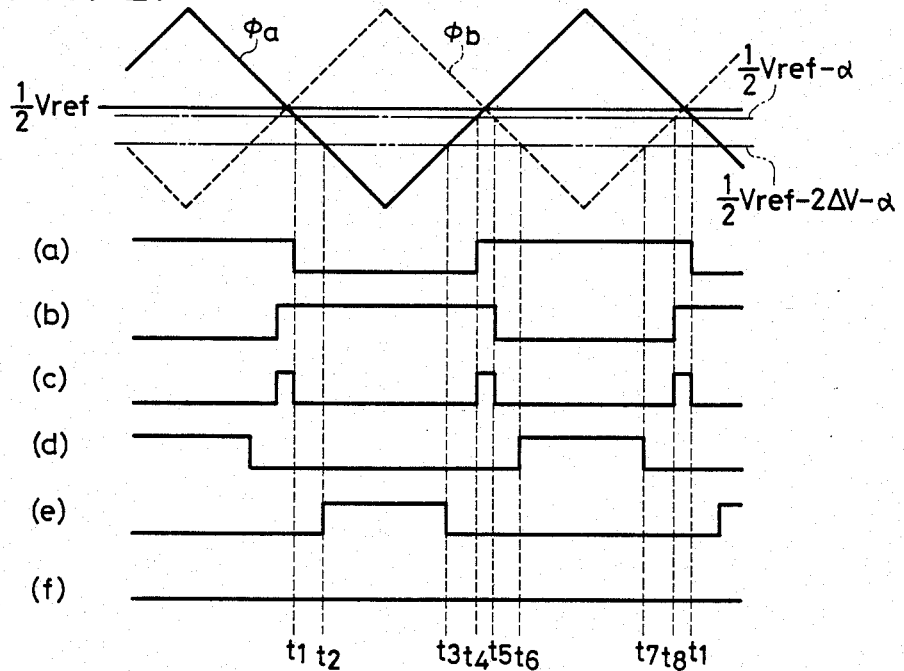

The PWM operation of the drive circuit will hereunder be described with reference to the waveform diagrams of FIGS. 19 to 21 with respect to three cases: where the signal level of the drive signal before level shifting is zero, greater than a predetermined level by more than $+\Delta V$, and greater than the predetermined level by less than $+\Delta V$. FIGS. 19 to 21 are waveform diagrams which illustrate the operation of the PWM circuit shown in FIG. 18; (a) to (f) show the waveforms of signals (a) to (f) noted in FIG. 18.

Suppose first the case where the drive signal level is zero (see FIG. 19). The signal level of the drive signal fed to the first comparator circuit 9A is level-shifted to $(\frac{1}{2})V_{ref}+\Delta V$ as indicated by the one-short-and-one-long dashed line, and the output (a) of comparator COMP$_3$ makes a transition from the high to the low level at time $t_1$ when the signal level of the triangular signal $\phi_a$ of the first phase becomes lower than the signal level of the level-shifted drive signal. The resulting low level is maintained up to time $t_4$ when the signal level of $\phi_a$ exceeds that of the drive signal. On the other hand, the output (b) of comparator COMP$_4$ makes a transition from the low to the high level at time $t_2$ when the signal level of the triangular signal $\phi_b$ of the second phase exceeds the signal level of the drive signal, and makes a transition to the initial low level at time $t_3$ when the signal level of $\phi_b$ becomes lower than that of the drive signal. However, the output (c) of AND gate 10, to the inputs of which are supplied the outputs (a) and (b), is at the low level at this point of time, and no output pulse signal will be produced by the AND gate 10.

With further reference to FIG. 19, the signal level of the drive signal fed to the second comparator circuit 9B is level-shifted to $(\frac{1}{2})V_{ref}-\Delta V$ as indicated by the two-short-and-one-long dashed line, and the output (d) of comparator COMP$_5$ makes a transition from the high to the low level at time $t_1$ when the signal level of the triangular signal $\phi_b$ of the second phase becomes higher than the signal level of the level-shifted drive signal. The resulting low level is maintained up to time $t_4$ when the signal level of $\phi_b$ becomes lower than the signal level of the drive signal. On the other hand, the output (e) of comparator COMP$_6$ makes a transition from the low to the high level at time $t_2$ when the signal level of the triangular signal $\phi_a$ of the first phase becomes lower than the signal level of the drive signal, and makes a transition to the initial low level at time $t_3$ when the signal level of $\phi_a$ exceeds that of the drive signal. However, the output (f) of AND gate 11, to the inputs of which are fed the outputs (d) and (e), is at the low level at this point of time, and no output pulse signal will be produced by the AND gate 11.

The case will now be considered where the drive signal level is greater than zero (ground level) by more than $+\Delta V$ ($\Delta V+\alpha$), with reference being made to the waveform diagram of FIG. 20. In this case, the signal level of the drive signal fed to the first comparator circuit 9A is level-shifted to $(\frac{1}{2})V_{ref}+2\Delta V+\alpha$ as indicated by the one-short-and-one-long dashed line, and the output (a) of comparator COMP$_3$ makes a transition from the high to the low level at time $t_1$ when the signal level of the triangular signal $\phi_a$ of the first phase becomes lower than the signal level of the level-shifted drive signal, and the resulting low level is maintained up to time $t_3$ when the signal level of $\phi_a$ exceeds that of the drive signal. On the other hand, the output (b) of comparator COMP$_4$ makes a transition from the low to the high level at time $t_4$ when the signal level of the triangular signal $\phi_b$ of the second phase exceeds the signal level of the drive signal, and makes a transition to the initial low level at time $t_5$ when the signal level of $\phi_b$ becomes lower than that of the drive signal. However, the output (c) of AND gate 10, to the inputs of which are fed the outputs (a) and (b), is at the low level at this point of time and no output pulse signal will be produced by the AND gate 10.

With further reference to FIG. 20, the signal level of the drive signal fed to the second comparator circuit 9B is level-shifted to $(\frac{1}{2})V_{ref}+\alpha$ as indicated by the two-short-and-one-long dashed line, and the output (d) of comparator COMP$_5$ makes a transition from the high to the low level at time $t_3$ when the signal level of the triangular signal $\phi_b$ of the second phase becomes higher than the signal level of the level-shifted drive signal. The resulting low level is maintained up to time $t_6$ when the signal level of $\phi_b$ becomes lower than the signal level of the drive signal. On the other hand, the output (e) of comparator COMP$_6$ makes a transition from the low to the high level at time $t_7$ when the signal level of the triangular signal $\phi_a$ of the first phase becomes lower than the signal level of the drive signal, and makes a transition to the initial low level at time $t_7$ when the signal level of $\phi_a$ exceeds that of the drive signal. As a consequence, the output (f) of AND gate 11, to the inputs of which are fed the outputs (d) and (e), attains a high level between $t_2$ and $t_3$ and also between $t_6$ and $t_7$, during which intervals the AND gate 11 produces an output pulse signal for forward driving.

Finally, the case will be considered where the drive signal level is greater than zero by less than $+\Delta V$ ($\Delta V - \alpha$), with reference being made to the waveform diagram of FIG. 21. In this case, the signal level of the drive signal fed to the first comparator circuit 9A is level-shifted to $(\frac{1}{2})V_{ref} - \alpha$ as indicated by the one-short-and-one-long dashed line, and the output (a) of comparator COMP$_3$ makes a transition from the high to the low level at time $t_1$ when the signal level of the triangular signal $\phi_a$ of the first phase becomes lower than the signal level of the level-shifted drive signal. The resulting low level is maintained up to time $t_4$ when the signal level of $\phi_a$ exceeds that of the drive signal. On the other hand, the output (b) of comparator COMP$_4$ makes a transition from the high to the low level at time $t_5$ when the signal level of the triangular signal $\phi_b$ of the second phase becomes lower than the signal level of the drive signal, and makes a transition to the initial high level at time $t_8$ when the signal level of $\phi_b$ exceeds that of the drive signal. As a result, the output (c) of AND gate 10, to the inputs of which are supplied the outputs (a) and (b), attains a high level between $t_4$ and $t_5$ and also between $t_8$ and $t_1$, during which intervals the AND gate 10 produces an output pulse signal for reverse driving.

Further referring to FIG. 21, the signal level of the drive signal fed to the second comparator circuit 9B is level-shifted to $(\frac{1}{2})V_{ref} - \Delta V - \alpha$ as indicated by the two-short-and-one-long dashed line, and the output (d) of comparator COMP$_5$ makes a transition from the low to the high level at $t_6$ when the signal level of the triangular signal $\phi_b$ of the second phase becomes lower than the signal level of the level-shifted drive signal. The resulting low level is maintained up to time $t_7$ when the signal level of $\phi_b$ becomes higher than the signal level of the drive signal. On the other hand, the output (e) of comparator COMP$_6$ makes a transition from the low to the high level at time $t_2$ when the signal level of the triangular signal $\phi_a$ of the first phase becomes lower than the signal level of the drive signal, and makes a transition to the initial low level at $t_3$ when the signal level of $\phi_a$ exceeds that of the drive signal. However, the output (f) of AND gate 11, to the inputs of which are fed the outputs (d) and (e), is at the low level at this point of time and no output pulse signal is produced by the AND gate 11.

As is apparent from the foregoing description, if the signal level of the drive signal before level shifting is within the range of zero $\pm \Delta V$, neither forward nor reverse driving pulses will be generated by the drive circuit of this embodiment of the present invention. In other words, the drive circuit of this embodiment is configured so that it is totally insensitive to any drive signal whose level is within the range of zero $\pm \Delta V$. Therefore, if the range of $\pm \Delta V$ is appropriately determined to correspond to the dead zone of motor M, no current will flow in the motor M when it is in its dead zone and any accompanying power loss is eliminated.

Referring back to FIG. 18, two pulse signals which correspond to the two different directions of motor driving are produced from AND gates 10 and 11, and the output from the AND gate 10 is fed to one input of AND gate 13, while the output from the AND gate 11 is fed to one input of AND gate 14. The drive signal is also fed to the comparison input of comparator COMP$_7$ for the purpose of determining the polarity of the drive signal with respect to the signal reference level $(\frac{1}{2})V_{ref}$. The comparison output of COMP$_7$ is fed to the data input of the D-type flip-flop 12, which is triggered by the Q output of the flip-flop R-S 4 and produces Q and $\overline{Q}$ outputs at a timing determined by the falling of the Q output of the R-S flip-flop 4. The Q and $\overline{Q}$ outputs thus produced form gate control signals which are supplied to the AND gates 14 and 13. The first or second pulse signal produced by the AND gates 13 and 14, corresponding to the respective two directions in which the motor M is to be driven, is supplied to motor drive circuit 18 through compensation circuits 15 and 16 and through predrive circuit 17, thus selectively causing the motor M to rotate in either the forward or reverse direction.

Figure 22:
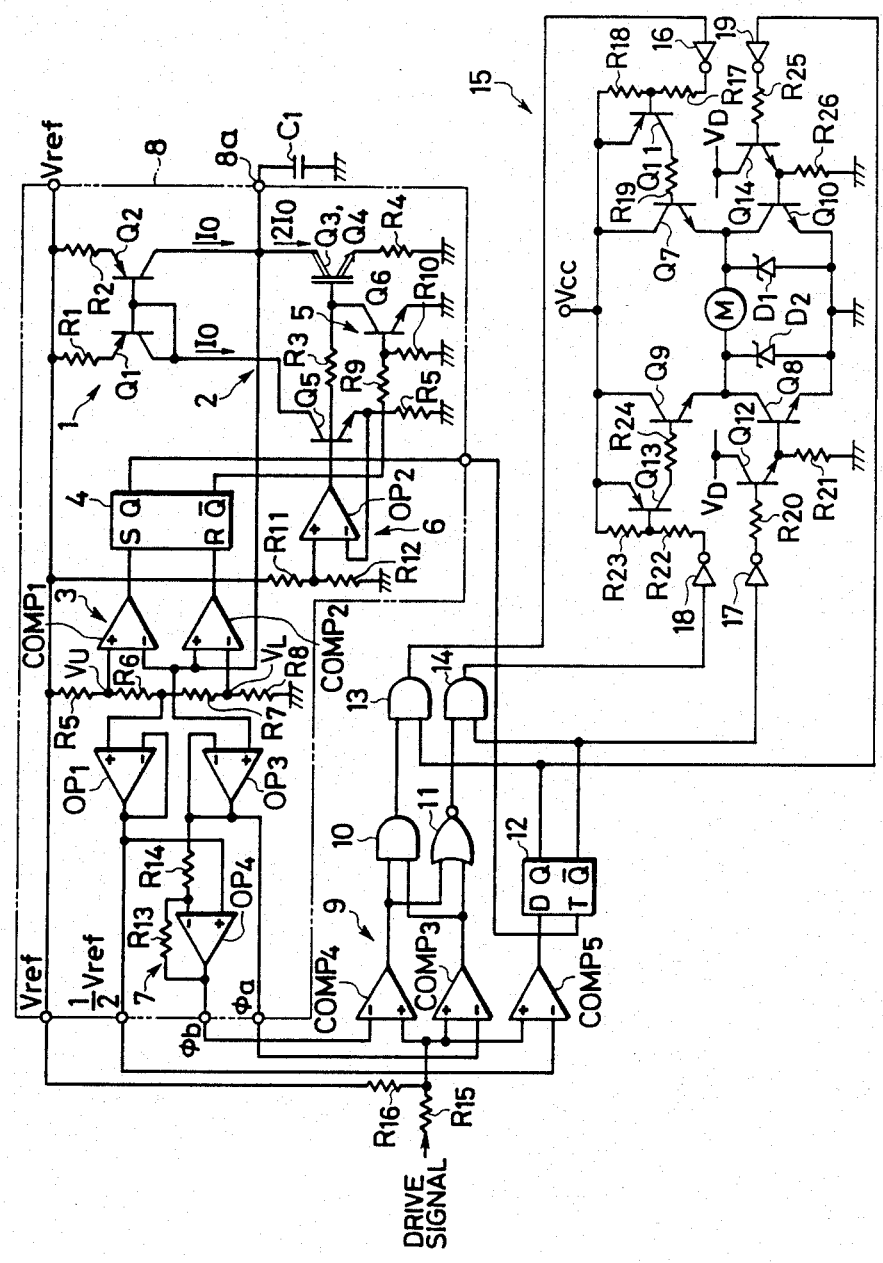
FIG. 22 is a circuit diagram, similar to FIGS. 6 and 18, showing a pulse-width modulation drive circuit of a third embodiment of the invention.

Referring now to FIG. 22, a still further embodiment of the present invention will be described. Elements which have already been described above, and which are designated by like reference numerals in FIGS. 6 and 22, will not be discussed in further, detail.

The Q output of the D-type flip-flop 12 serves as a signal for indicating the driving of motor M in the forward direction, whereas the $\overline{Q}$ output serves as a signal for indicating the driving of motor M in the reverse direction. As a result, the first pulse signal from the AND gate 13 serves as a forward driving pulse, whereas the second pulse signal from the AND gate 14 serves as a reverse driving pulse. These two driving pulses are fed to a motor drive circuit 15.

In the motor drive circuit 15, a first pair of npn transistors $Q_7$ and $Q_8$ are connected in series with a load, namely, motor M, between a power supply $V_{cc}$ and ground, and a second pair of npn transistors $Q_9$ and $Q_{10}$ are likewise connected in series with the motor M. The transistor $Q_7$ on the power supply side is driven by a predrive stage composed of resistors $R_{17}$ to $R_{19}$ and a pnp transistor $Q_{11}$. This predrive stage is fed with a forward driving pulse supplied from the AND gate 13 through an inverter 16. At the same time, a predrive stage composed of resistors $R_{20}$ and $R_{21}$ and a transistor $Q_{12}$ is fed with the $\overline{Q}$ output of the D-type flip-flop 12 through an inverter 17. In a similar manner, the transistor $Q_9$ on the power supply side is driven by a predrive stage composed of resistors $R_{22}$ to $R_{24}$ and a pnp transistor $Q_{13}$. This predrive stage is fed with a forward driving pulse supplied from the AND gate 15 through an inverter 18. Also, a predrive stage composed of resistors, $R_{25}$ and $R_{26}$ and a transistor $Q_{14}$ is fed with the Q output of the D-type flip-flop 12 through an inverter 19. A unidirectional element such as a Schottky diode $D_1$ is connected between one end of the motor M and ground, and another Schottky diode $D_2$ is connected between the other end of the motor M and ground.

In the motor drive circuit 15 having the configuration shown above, the transistors $Q_7$ and $Q_8$ on the power supply side are duty-cycle controlled by driving pulses from the AND gates 13 and 14, while the transistors $Q_8$ and $Q_{10}$ on the ground side are driven by the $\overline{Q}$ and Q outputs of the D-type flip-flop 12, or the information ion for determining the polarities of the driving pulses with respect to the signal reference level. As a result, the transistors $Q_8$ and $Q_{10}$ on the ground side are always in the on state when the motor is being driven in a given direction, and only the transistors $Q_7$ and $Q_9$ on the power supply side alternate between on and off states in accordance with the driving pulses being inputted.

Referring still to FIG. 22, two pulse signals having pulse widths corresponding to the polarity and signal level of a drive signal are produced from AND gate 10 and NOR gate 11, and the output from AND gate 1 is fed to one input of AND gate 13, while the output from NOR gate 11 is fed to one input of AND gate 14. The drive signal is also fed to the comparison input of comparator $COMP_5$ for the purpose of determining the polarity of the drive signal with respect to the signal reference level. The comparison output of $COMP_5$ is fed to the data input of the D-type flip-flop 12, is triggered by the Q output of the R-S flip-flop 4 and produces Q and $\overline{Q}$ outputs at a timing determined by the falling edge of the Q output of the R-S flip-flop 4. The Q and $\overline{Q}$ outputs thus produced form gate control signals which are supplied to the AND gates 13 and 14. The two outputs also serve as drive signals for the transistors $Q_{10}$ and $Q_8$ on the ground side in the motor drive circuit 15. The drive pulses associated with the motor driving direction outputted by the AND gates 13 and 14 serve as drive signals for the transistors $Q_7$ and $Q_9$ on the power supply side in the motor drive circuit 15.

As already discussed, the transistors $Q_7$ and $Q_9$ on the power supply side in the motor drive circuit 15 are duty-cycle controlled by drive pulses from the AND gates 13 and 14, and the transistors $Q_8$ and $Q_{10}$ on the ground side are driven by the $\overline{Q}$ and Q outputs of the D-type flip-flop 12, that is, the information for determining the polarities of the drive signals with respect to the signal reference level. To take the mode of forward driving as an example, the transistor $Q_8$ on the ground side is locked by the $\overline{Q}$ output of the D-type flip-flop 12 and is maintained in the on state throughout the period during which the motor is driven in the forward direction, while the transistor $Q_7$ on the power supply side alternates between on and off states in response to the drive pulse from the AND gate 13.

If the transistor $Q_7$ on the power supply side makes a transition from the on to the off state while the transistor $Q_8$ on the ground side is in the on state, the energy which has been stored in the coil of motor M produces a reverse electromotive force which flows through a closed loop including transistor $Q_8$, Schottky diode $D_1$, and motor M, and is consumed as driving energy in the resistance of motor M. In this closed loop, only the voltage drop caused by Schottky diode $D_1$ provides $V_F$ in equation (7). Since this is equivalent to the presence of one diode, the energy loss due to the reverse electromotive force is smaller than in the prior art power drive stage discussed above. If $V_F$ of Schottky diode $D_1$ is assumed to be about 0.4 volts, the efficiency $\eta$ as calculated from equation (7) is about 83.4%, which is much higher than 60.6%, the value attained when two diodes are employed.

The Schottky diodes $D_1$ and $D_2$ used as unidirectional elements for absorbing reverse electromotive force cause a voltage drop of only about 0.6 volts, which is effective in reducing the current which flows in transistors $Q_8$ and $Q_{10}$ after they have been turned off. As a result, the motor drive circuit 15 can be fabricated in IC form without danger of misoperation of the internal circuit elements As described above, the switching drive circuit of the present invention is configured so that the pulse width of an input pulse signal is increased by a predetermined degree to produce a pulse signal by which a load is driven. By employing the circuit configuration of the present invention, the energy loss occurring in reverse EMF absorbing diodes (unidirectional elements) is compensated, with the result that the linearity of the input-/output characteristics of the drive circuit while fed with a drive signal of a small pulse width are sufficiently improved to attain a higher efficiency in driving the load.

Moreover, as the switching drive circuit of the present invention incorporates switching means for shorting the transistors in the power drive stage between their base and emitter momentarily when the applied pulses cease, the transistors are allowed to become fully off momentarily after the disappearance of the drive pulses, and thus the possibility of simultaneous turning on the transistors in the power drive stage because of the delay time ($t_{off}$) of each transistor can be effectively eliminated.

In addition, the polarity of the drive signal is determined with respect to the signal reference level, and only a drive pulse that corresponds to a certain direction of driving, determined as a result of the polarity determination, is supplied to the power drive stage. As a result of this circuit design, the possibility of simultaneous turning on of transistors in the power drive stage because of the delay time ($t_{off}$) of these transistors is effectively eliminated.

Also, a drive pulse for one direction is supplied to the power drive stage after it is delayed by a predetermined time, while the supply of a drive pulse for the other direction to the power drive stage is inhibited during the time interval between the generation of the first pulse signal and a point a predetermined time after the disappearance of the first pulse signal. As a result, the possibility of simultaneous turning on of the transistors in the power drive stage because of the delay time ($t_{off}$) of these transistors in effectively eliminated.

Moreover, because the drive circuit of the present invention is configured so that by controlling the ramp rate and peak value of the triangular signals in accordance with variations in the supply voltage, the pulse width of the drive pulse is properly adjusted for the same level of drive signal. With this arrangement, the drive power is made constant for the same drive signal level, even if variations occur in the supply voltage, and, as a result, consistent circuit operation is ensured regardless of any variations in the supply voltage.

Still further, in the PMW drive circuit of the present invention configured so that only the linear portion of a triangular signal is used for producing a load-driving pulse signal, the circuit is totally insensitive to any ringing or flattening that may occur at the apex of individual peaks of the triangular wave, and hence provides an input vs. output characteristic of improved linearity, even when the drive signal has a small signal level.

Further, as described in the foregoing, the triangular wave generator circuit of the present invention includes a first constant-current source which has a constant current rating twice the value for the first constant-current source, and is configured so that it produces a triangular signal by charging and discharging a capacitor (charge storing means) at a constant current rate with on-off control being performed on the second constant-current source. In this circuit, only one end of the capacitor need be connected to a reference potential point, and hence the overall circuit can be fabricated as an IC device with the capacitor being externally connected at only one terminal pin, rather than the two pins required in the prior art circuit.

Finally, as also described above, the power drive stage of a PWM drive circuit of the embodiment of the present invention which includes npn transistors on the power supply side is configured so that a unidirectional element for absorbing reverse electromotive force is connected between each terminal of the load and ground, and the transistors on the power supply side are driven by a pulse signal while those on the ground side are driven by a signal indicating the direction in which the load is to be driven. Due to this configuration, the PWM drive circuit of the present invention attains a higher efficiency in driving the load by reducing the energy loss occurring in the diodes (unidirectional elements) serving to absorb reverse electromotive force.

What is claimed is:

1. In a switching drive circuit which has a unidirectional element for absorbing reverse electromotive force across a load and which drives said load by switching current flow through said load on and off in response to a predetermined pulse signal, the improvement wherein said drive circuit comprises:

compensating circuit means receiving said predetermined pulse signal as an input and providing a drive pulse signal for said load, said drive pulse signal having a pulse width larger than a pulse width of said predetermined pulse signal by a predetermined amount, whereby an absorption of energy in said unidirectional element is compensated when said unidirectional element is absorbing said reverse electromotive force.

2. The switching drive circuit according to claim 1, wherein said compensating circuit means comprises means for producing a pulse signal in response to said predetermined pulse signal having a pulse width equivalent to a time interval between generation of said predetermined pulse signal and a point a predetermined time after disappearance of said predetermined pulse signal, the pulse signal thus produced being said drive pulse signal.

3. The switching drive circuit according to claim 1, wherein said compensating circuit means comprises means for producing a second pulse signal in response to said predetermined pulse signal having a given pulse width, and a logical addition circuit which receives the second pulse signal so produced and said predetermined pulse signal as two inputs, a resulting pulse signal produced by said logical addition circuit being said drive pulse signal.

4. In a switching drive circuit which includes a first transistor which supplies a load with a drive current for a forward direction in response to a first level of a first pulse signal, and a second transistor which supplies said load with a drive current for a reverse direction in response to a first level of a second pulse signal, said drive circuit driving said load by switching a current through said load on and off in response to said first and second pulse signals, the improvement wherein said drive circuit further comprises: first switching means controlled by said first pulse signal for shorting said first transistor between its base and emitter in response to a disappearance of said first level of said first pulse signal to thereby discharge an inherent base-emitter capacitance of said first transistor, and second switching means controlled by said second pulse signal for shorting said second transistor between its base and emitter in response to a disappearance of said first level of said second pulse signal to thereby discharge an inherent base-emitter capacitance of said second transistor.

5. A pulse-width-modulation drive circuit which produces a pulse signal with a pulse width which is dependent on a level of a drive signal and which drives a load by switching a current through said load on and off in response to the pulse signal so produced, said drive circuit comprising: triangular wave generating means for generating two triangular signals having substantially equal peak values and which are opposite to each other in phase, a comparator circuit receiving said two triangular signals of opposite phases as upper and lower reference input signals, respectively, and receiving said drive signal as a comparison input, first gate means for producing first and second pulse signals in response to an output of said comparator circuit, said first and second pulse signals corresponding to two directions in which said load is to be driven, polarity detecting means for determining a polarity of said drive signal with respect to a signal reference level, and second gate means for outputting only one of said first and second pulse signals in response to a result of detection by said polarity detecting means, said drive circuit driving said load in response to an output of said second gate means.

6. A pulse-width-modulation drive circuit which produces a pulse signal with a pulse width which is dependent on a level of a drive signal and which drives a load by switching a current through said load on and off in response to the pulse signal so produced, said drive circuit comprising: a power load drive circuit coupled directly to said load, triangular wave generating means for generating two triangular signals having substantially equal peak values and which are opposite to each other in phase, a comparator circuit receiving said two triangular signals of opposite phases as upper and lower reference inputs, respectively, and receiving said drive signal as a comparison input, first and second gate means for producing first and second pulse signals in response to an output of said comparator circuit, said first and second pulse signals corresponding to two respective directions in which said load is to be driven, and first and second inhibiting means for inhibiting supply of said delayed first and second pulse signals from said first and second delay means to said load drive circuit during a time interval between generation of said first and second pulse signals and a point a predetermined time after disappearance of said first and second pulse signals.

7. The drive circuit according to claim 5, wherein said predetermined time is set to a value approximately twice a delay time of each of said first and second delay means.

8. In a pulse-width-modulation drive circuit which produces a pulse signal with a pulse width dependent on a level of a drive signal and which drives a load by switching a current through said load on and off in response to the pulse signal so produced, the improvement wherein said drive circuit comprises: triangular wave generating means for generating two triangular signals which have substantially equal peak values and which are opposite to each other in phase, and a first comparator circuit receiving said triangular signals of opposite phases as upper and lower reference inputs, respectively, and receiving said drive signal as a comparison input, said triangular wave generating means comprising a first constant-current source, a second constant-current source connected in series with said first constant-current source and producing twice the amount of current as that produced by said first constant-current source, charge-storing means connected between a common junction of said first and second constant-current sources and a reference potential point, a second comparator circuit for monitoring an output level of said charge-storing means, control means for selectively activating and deactivating said second constant-current source in response to an output of said second comparator circuit, current value setting means for setting amounts of constant current produced by said first and second constant-current sources, said current value setting means controlling said amounts of constant current of said first and second constant-current sources in accordance with a variation in a supply voltage, and means for providing as a comparison reference level for said second comparator circuit a voltage determined by division of said supply voltage, said two triangular signals of opposite phases being outputting in response to an output signal from said charge-storing means.

9. A triangular wave generator circuit comprising: a first constant-current source, a second constant-current source connected in series with said first constant-current source and supplying twice the amount of current as said first constant-current source, charge-storing means connected between a common junction of said first and second constant-current sources and a reference potential point, a comparator circuit for monitoring an output level of said charge-storing means, and control means for activating said second constant-current source in response to an output of said comparator circuit, an output signal of said charge-storing means being produced as a triangular signal.

10. In a pulse-width-modulation drive circuit operated from a supply voltage, said drive circuit producing a pulse signal having a pulse width dependent on a signal level of a drive signal and driving a load by switching a current through said load on and off in response to said pulse signal, the improvement wherein said drive circuit comprises: a triangular wave generator circuit for generating two triangular signals having substantially equal peak values and which are opposite to each other in phase, and a first comparator circuit receiving said two triangular signals of opposite phases as upper and lower reference inputs, respectively, and receiving said drive signal as a comparison input, a circuit reference level of said triangular wave generator circuit and a d.c. bias level of said drive signal being set to values determined by division of said supply voltage.

11. The device circuit according to claim 9, wherein said triangular wave generator circuit comprises a constant-current source, a second constant-current source connected in series with said first constant-current source and which supplies twice the amount of current as said first constant-current source, charge-storing means connected between a common junction of said first and second constant-current sources and a reference potential point, a second comparator circuit for monitoring an output level of said charge-storing means, and control means for selectively activating and deactivating said second constant-current source in response to an output of said comparator circuit, a comparison reference level of said second comparator circuit serving as a circuit reference level of said triangular wave generator.

12. In a pulse-width-modulation drive circuit for use with a motor which includes pulse generating means for generating a pulse signal having a pulse width dependent on a signal level of a drive signal, said motor being driven by switching a current through said motor on and off in response to said pulse signal, the improvement wherein said pulse generating means comprises: triangular wave generating means for generating two triangular signals which have substantially equal peak values and which are opposite to each other in phase, a first comparator circuit comprising a pair of comparators receiving said triangular signals of opposite phases on their noninverting inputs and said drive signal shifted from a center level of each triangular signal by a predetermined positive level on their inverting inputs, and a second comparator circuit comprising a pair of comparators receiving said triangular signals of opposite phases on their inverting inputs and said drive signal shifted from a center level of each triangular signal by a predetermined negative level on their noninverting inputs, said drive circuit producing said pulse signal in response to outputs of said first and second comparator circuits, and means for setting said predetermined positive and negative levels in accordance with values determined by division of said supply voltage.

13. In a pulse-width modulation drive circuit which includes a first pair of transistors connected in series with a load between a power supply and ground and each of which is actuated to supply said load with a drive current in a forward direction, and a second pair of transistors connected in series with said load between said power supply and ground and each of which is actuated to supply said load with a drive current in a reverse direction, a two of said first and second pairs of transistors which are on a power supply side being npn transistors, and said load being driven by switching a current through said load on and off in response to a pulse signal having a pulse width which is dependent on a signal level of said drive signal, the improvement wherein said pulse-width modulation drive circuit further comprises: triangular wave generating means for generating two triangular signals which have substantially equal peak values and which are opposite to each other in phase, a comparator circuit receiving said two triangular signals of opposite phases as upper and lower reference inputs, respectively, and said drive signal as a comparison input, means for producing in response to an output from said comparator first and second output pulse signals corresponding to two directions in which said load is to be driven, polarity determining means for determining a polarity of said drive signal with respect to a signal reference level, and first and second unidirectional elements for absorbing reverse electromotive force, one of said unidirectional elements being connected between one terminal of said load and ground and the other being connected between the other terminal of said load and ground, said two of said first and second pairs of transistors which are on said power supply side being driven by said first and second pulse signals, and a two of said first and second pairs of transistors which are on a ground side being driven by a decision output from said polarity determining means.

14. The drive circuit according to claim 13, wherein said first and second unidirectional elements are Schottky diodes.

15. The switching circuit according to claim 1, wherein said predetermined amount is determined to compensate for said absorption.

16. The switching circuit according to claim 1, wherein said predetermined amount increases with an increase of said pulse width of said predetermined pulse signal over a range of said increase up to a maximum pulse width of said drive pulse signal.

* * * * *